(12) United States Patent
Akita et al.

(10) Patent No.: US 7,759,045 B2
(45) Date of Patent: Jul. 20, 2010

(54) CHEMICALLY AMPLIFIED POSITIVE RESIST COMPOSITION

(75) Inventors: Makoto Akita, Hsin-Chu (TW); Isao Yoshida, Ikeda (JP); Yukako Harada, Settsu (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 12/213,800

(22) Filed: Jun. 24, 2008

(65) Prior Publication Data

US 2009/0004601 A1 Jan. 1, 2009

(30) Foreign Application Priority Data

Jun. 27, 2007 (JP) ............................. 2007-168689

(51) Int. Cl.
*G03F 7/004* (2006.01)
(52) U.S. Cl. .................. 430/270.1; 430/905; 430/910; 430/921; 430/922
(58) Field of Classification Search ............. 430/270.1, 430/905, 910, 921, 922
See application file for complete search history.

(56) References Cited

U.S. PATENT DOCUMENTS 5,202,216 A * 4/1993 Aotani et al. ............... 430/176
5,364,738 A * 11/1994 Kondo et al. .............. 430/283.1
7,175,963 B2 * 2/2007 Fuji et al. ................ 430/270.1
2003/0013038 A1 1/2003 Ichimura et al.
2005/0014095 A1 * 1/2005 Yamaguchi et al. ...... 430/270.1
2005/0042540 A1 2/2005 Okubo et al.

FOREIGN PATENT DOCUMENTS

JP 2006-330401 A 12/2006

* cited by examiner

*Primary Examiner*—John S Chu
(74) *Attorney, Agent, or Firm*—Birch, Stewart, Kolasch & Birch, LLP

(57) ABSTRACT

A chemically amplified positive resist composition comprising (A) a salt represented by the formula (I):

$$A^+\ {}^-O_3S\text{—}R \quad (I)$$

wherein R represents a 9,10-anthraquinonyl group which may be substituted with at least one group selected from the group consisting of a C1-C4 alkyl group, a C1-C4 alkoxy group and a hydroxyl group, and the C1-C4 alkyl group and the C1-C4 alkoxy group may be substituted, and $A^+$ represents an organic counter cation, and (B) a resin which contains a structural unit which has an acid-labile group and which itself is insoluble or poorly soluble in an aqueous alkali solution but becomes soluble in an aqueous alkali solution by the action of an acid.

8 Claims, No Drawings

CHEMICALLY AMPLIFIED POSITIVE RESIST COMPOSITION

This nonprovisional application claims priority under 35 U.S.C. §119(a) on Patent Application No. 2007-168689 filed in JAPAN on Jun. 27, 2007, the entire contents of which are hereby incorporated by reference.

FIELD OF THE INVENTION

The present invention relates to a chemically amplified positive resist composition.

BACKGROUND OF THE INVENTION

A chemically amplified positive resist composition is used for semiconductor microfabrication employing a lithography process using i-rays, KrF, ArF and electron beam; forming a bump or a thick film resist pattern in the production of semiconductor devices; forming a wiring pattern or a thick film resist laminated body in the production of circuit board; and the like.

It is expected for the chemically amplified resist composition to give patterns having high resolution and good pattern profile.

US 2005/0042540 A1 discloses a chemically amplified positive resist composition comprising a resin which comprises a polymerization unit derived from hydroxystyrene and a polymerization unit derived from a (meth)acrylate ester, and an acid generator.

SUMMARY OF THE INVENTION

The present invention relates to the followings:

<1> A chemically amplified positive resist composition comprising (A) a salt represented by the formula (I):

wherein R represents a 9,10-anthraquinonyl group which may be substituted with at least one group selected from the group consisting of a C1-C4 alkyl group, a C1-C4 alkoxy group and a hydroxyl group, and the C1-C4 alkyl group and the C1-C4 alkoxy group may be substituted, and $A^+$ represents an organic counter cation, and (B) a resin which contains a structural unit which has an acid-labile group and which itself is insoluble or poorly soluble in an aqueous alkali solution but becomes soluble in an aqueous alkali solution by the action of an acid;

<2> The chemically amplified positive resist composition according to <1>, wherein R represents an unsubstituted 9,10-anthraquinonyl group;

<3> The chemically amplified positive resist composition according to <1> or <2>, wherein the content of the structural unit which has an acid-labile group in the resin is 5 to 80% by mole based on the sum of all the structural units in the resin;

<4> The chemically amplified positive resist composition according to any one of <1> to <3>, wherein the structural unit which has an acid-labile group is a structural unit derived from a 2-alkyl-2-adamantyl acrylate, a 2-alkyl-2-adamantyl methacrylate, a 1-(1-adamantyl)-1-alkylalkyl acrylate or a 1-(1-adamantyl)-1-alkylalkyl methacrylate;

<5> The chemically amplified positive resist composition according to any one of <1> to <4>, wherein the resin further comprises at least one structural unit selected from the group consisting of a structural unit derived from a hydroxystyrene and a structural unit derived from acyloxystyrene;

<6> The chemically amplified positive resist composition according to any one of <1> to <5>, wherein the chemically amplified positive resist composition further comprises a onium salt as an acid generator;

<7> The chemically amplified positive resist composition according to any one of <1> to <6>, wherein the chemically amplified positive resist composition further comprises a diazomethane compound having a sulfonyl group as an acid generator;

<8> The chemically amplified positive resist composition according to any one of <1> to <7>, wherein the chemically amplified positive resist composition further comprises a basic compound.

DESCRIPTION OF PREFERRED EMBODIMENTS

The present chemically amplified positive resist composition comprises (A) a salt represented by the formula (I):

wherein R represents a 9,10-anthraquinonyl group which may be substituted with at least one group selected from the group consisting of a C1-C4 alkyl group, a C1-C4 alkoxy group and a hydroxyl group, and the C1-C4 alkyl group and the C1-C4 alkoxy group may be substituted, and $A^+$ represents an organic counter cation, and (B) a resin which contains a structural unit which has an acid-labile group and which itself is insoluble or poorly soluble in an aqueous alkali solution but becomes soluble in an aqueous alkali solution by the action of an acid.

In the formula (I), R represents a 9,10-anthraquinonyl group which may be substituted with at least one group selected from the group consisting of a C1-C4 alkyl group, a C1-C4 alkoxy group and a hydroxyl group.

Examples of the C1-C4 alkyl group include a methyl group, an ethyl group, an n-propyl group, an isopropyl group, an n-butyl group, an isobutyl group, a sec-butyl group and a tert-butyl group. Examples of the C1-C4 alkoxy group include a methoxy group, an ethoxy group, an n-propoxy group, an isopropoxy group, an n-butoxy group, an isobutoxy group, a sec-butoxy group and a tert-butoxy group. While the C1-C4 alkyl group and the C1-C4 alkoxy group may be substituted, unsubstituted C1-C4 alkyl group and unsubstituted C1-C4 alkoxy group are preferable. R preferably represents an unsubstituted 9,10-anthraquinonyl group.

Examples of an anion part of the salt represented by the formula (I) include the followings.

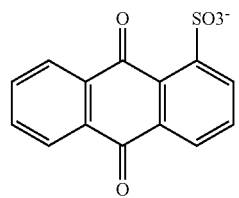

-continued

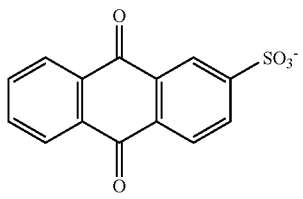
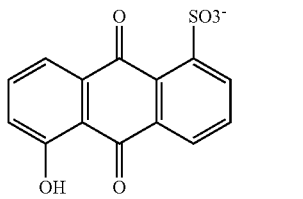
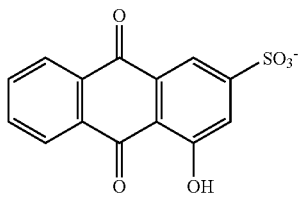
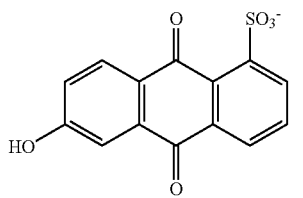
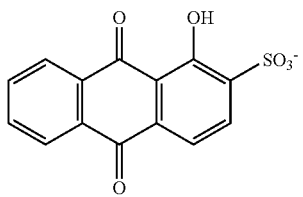
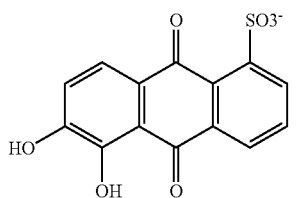
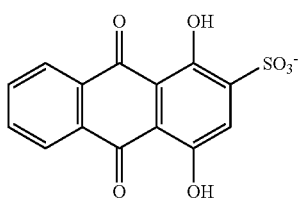

-continued

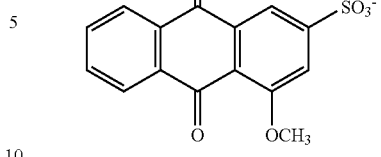
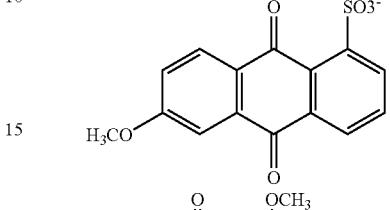
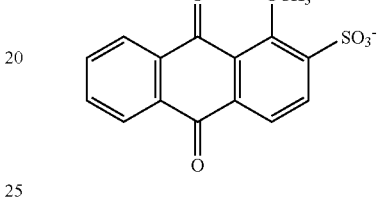

$A^+$ represents an organic counter cation, and

Examples of the organic counter cation include the following cations represented by the formulae (VIIIa), (VIIIb), (VIIIc) and (VIIId):

(VIIIa)

wherein $P^1$, $P^2$ and $P^3$ each independently represent a C1-C30 alkyl group which may be substituted with at least one selected from a hydroxyl group, a C3-C12 cyclic hydrocarbon group and a C1-C12 alkoxy group, or a C3-C30 cyclic hydrocarbon group which may be substituted with at least one selected from a hydroxyl group and a C1-C12 alkoxy group, a cation represented by the formula (VIIIb):

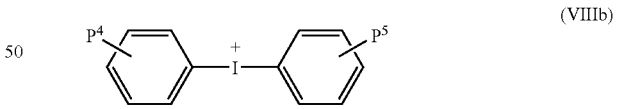

(VIIIb)

wherein $P^4$ and $P^5$ each independently represent a hydrogen atom, a hydroxyl group, a C1-C12 alkyl group or a C1-C12 alkoxy group, a cation represented by the formula (VIIIc):

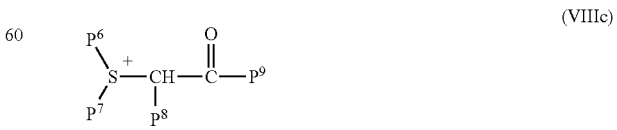

(VIIIc)

wherein $P^6$ and $P^7$ each independently represent a C1-C12 alkyl group or a C3-C12 cycloalkyl group, or $P^6$ and $P^7$ are

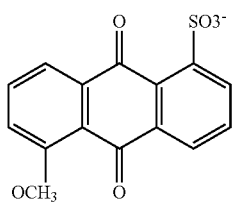

bonded to form a C3-C12 divalent acyclic hydrocarbon group which forms a ring together with the adjacent S⁺, and at least one —CH$_2$— in the divalent acyclic hydrocarbon group may be substituted with —CO—, —O— or —S—, P$^8$ represents a hydrogen atom, P$^9$ represents a C1-C12 alkyl group, a C3-C12 cycloalkyl group or an aromatic group which may be substituted, or P$^8$ and P$^9$ bond to form a divalent acyclic hydrocarbon group which forms a 2-oxocycloalkyl group together with the adjacent —CHCO—, and at least one —CH$_2$— in the divalent acyclic hydrocarbon group may be substituted with —CO—, —O— or —S—, and a cation represented by the formula (VIIId):

a 4-hydroxyphenyl group, a 4-methoxyphenyl group, a 4-tert-butoxyphenyl group, a 4-n-hexyloxyphenyl group.

Examples of the C1-C12 alkyl group in the formulae (VIIIb), (VIIIc) and (VIIId) include a methyl group, an ethyl group, an n-propyl group, an isopropyl group, an n-butyl group, an isobutyl group, a sec-butyl group, a tert-butyl group, an n-pentyl group, an n-hexyl group, an n-octyl group and a 2-ethylhexyl group. Examples of the C1-C12 alkoxy group in the formulae (VIIIb) and (VIIId) include the same groups as mentioned in the above formula (VIIIa).

Examples of the C3-C12 cycloalkyl group in the formula (VIIIc) include a cyclopropyl group, a cyclobutyl group, a cyclopentyl group, a cyclohexyl group, a cycloheptyl group,

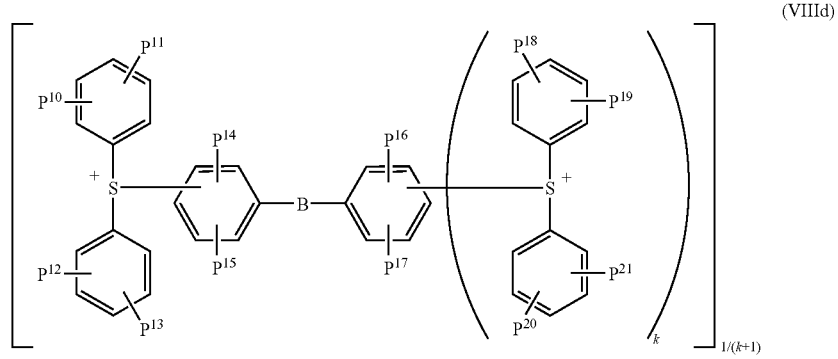

(VIIId)

wherein P$^{10}$, P$^{11}$, P$^{12}$, P$^{13}$, P$^{14}$, P$^{15}$, P$^{16}$, P$^{17}$, P$^{18}$, P$^{19}$, P$^{20}$ and P$^{21}$ each independently represent a hydrogen atom, a hydroxyl group, a C1-C12 alkyl group or a C1-C12 alkoxy group, B represents a sulfur or oxygen atom and k represents 0 or 1.

Examples of the C1-C12 alkoxy group in the formula (VIIIa) include a methoxy group, an ethoxy group, an n-propoxy group, an isopropoxy group, an n-butoxy group, an isobutoxy group, a sec-butoxy group, a tert-butoxy group, an n-pentyloxy group, an n-hexyloxy group, an n-octyloxy group and a 2-ethylhexyloxy group. Examples of the C3-C12 cyclic hydrocarbon group in the formula (VIIIa) include a cyclopentyl group, a cyclohexyl group, a 1-adamantyl group, a 2-adamantyl group, a phenyl group, a 2-methylphenyl group, a 4-methylphenyl group, a 1-naphthyl group and a 2-naphthyl group.

Examples of the C1-C30 alkyl group which may be substituted with at least one selected from the hydroxyl group, the C3-C12 cyclic hydrocarbon group and the C1-C12 alkoxy group in the formula (VIIIa) include a methyl group, an ethyl group, an n-propyl group, an isopropyl group, an n-butyl group, an isobutyl group, a sec-butyl group, a tert-butyl group, an n-pentyl group, an n-hexyl group, an n-octyl group, a 2-ethylhexyl group and a benzyl group.

Examples of the C3-C30 cyclic hydrocarbon group which may be substituted with at least one selected from the hydroxyl group and the C1-C12 alkoxy group in the formula (VIIIa) include a cyclopentyl group, a cyclohexyl group, a 1-adamantyl group, a 2-adamantyl group, a bicyclohexyl group, a phenyl group, a 2-methylphenyl group, a 4-methylphenyl group, a 4-ethylphenyl group, a 4-isopropylphenyl group, a 4-tert-butylphenyl group, a 2,4-dimethylphenyl group, a 2,4,6-trimethylphenyl group, a 4-n-hexylphenyl group, a 4-n-octylphenyl group, a 1-naphthyl group, a 2-naphthyl group, a fluorenyl group, a 4-phenylphenyl group, a cyclooctyl group and a cyclodecyl group. Examples of the C3-C12 divalent acyclic hydrocarbon group formed by bonding P$^6$ and P$^7$ include a trimethylene group, a tetramethylene group, a pentamethylene group. Examples of the ring group formed together with the adjacent S⁺ and the divalent acyclic hydrocarbon group include a tetramethylenesulfonio group, a pentamethylenesulfonio group and an oxybisethylenesulfonio group.

Examples of the aromatic group in the formula (VIIIc) include a phenyl group, a tolyl group, a xylyl group and a naphthyl group. Examples of the divalent acyclic hydrocarbon group formed by bonding P$^8$ and P$^9$ include a methylene group, an ethylene group, a trimethylene group, a tetramethylene group and a pentamethylene group and examples of the 2-oxocycloalkyl group formed together with the adjacent —CHCO—and the divalent acyclic hydrocarbon group include a 2-oxocyclopentyl group and a 2-oxocyclohexyl group.

The cation represented by the formula (VIIIa) or (VIIIc) is preferable and the cation represented by the formula (VIIIa) is more preferable.

As the counter cation represented by A⁺, cations represented by the following formulae (VIIIe), (VIIIf) and (VIIIg):

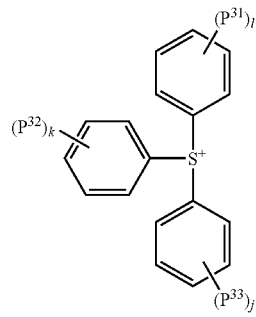

(VIIIe)

-continued (VIIIf)

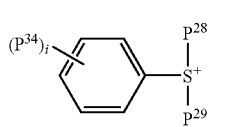

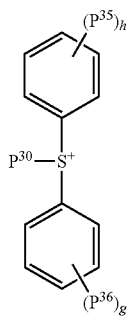

wherein $P^{28}$, $P^{29}$ and $P^{30}$ each independently represent a C1-C20 alkyl group or a C3-C30 cyclic hydrocarbon group except a phenyl group, and at least one hydrogen atom in the C1-C20 alkyl group may be substituted with a hydroxyl group, a C1-C12 alkoxy group or a C3-C12 cyclic hydrocarbon group and at least one hydrogen atom in the C3-C30 cyclic hydrocarbon group may be substituted with a hydroxyl group, a C1-C12 alkyl group or a C1-C12 alkoxy group, and $P^{31}$, $P^{32}$, $P^{33}$, $P^{34}$, $P^{35}$ and $P^{36}$ each independently represent a hydroxyl group, a C1-C12 alkyl group, a C1-C12 alkoxy group or a C3-C12 cyclic hydrocarbon group, and l, k, j, i, h and g each independently represent an integer of 0 to 5, are also preferable.

Examples of the C1-C20 alkyl group include a methyl group, an ethyl group, an n-propyl group, an isopropyl group, an n-butyl group, a tert-butyl group, an n-hexyl group, an n-octyl group, an n-decyl group and an n-icosyl group.

Examples of the C1-C12 alkoxy group and the C3-C30 cyclic hydrocarbon group include the same groups as mentioned above.

As the counter cation represented by $A^+$, a cation represented by the formula (VIIIh):

(VIIIh)

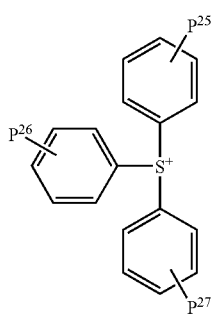

wherein $P^{25}$, $P^{26}$ and $P^{27}$ each independently represent a hydrogen atom, a hydroxyl group, a C1-C12 alkyl group or a C1-C12 alkoxy group, is more preferable, and a cation represented by the formula (VIIIi):

(VIIIi)

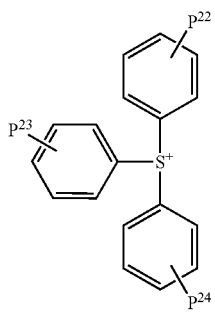

wherein $P^{22}$, $P^{23}$ and $P^{24}$ each independently represent a hydrogen atom or a C1-C4 alkyl group, is especially preferable.

Examples of the alkyl group and the alkoxy group include the same groups as mentioned above.

Examples of the cation represented by the formula (VIIIa) include the followings.

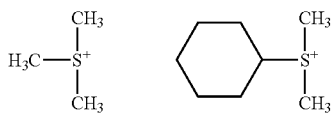

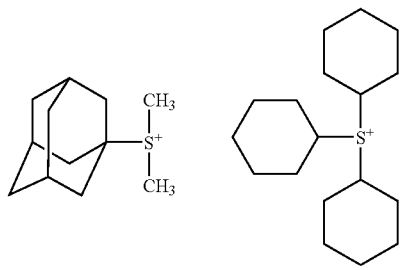

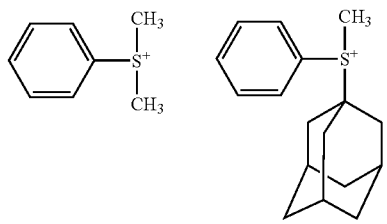

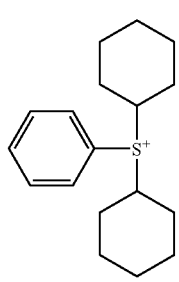 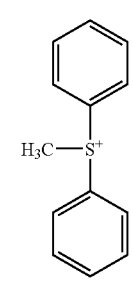

-continued
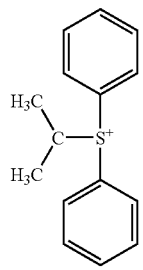 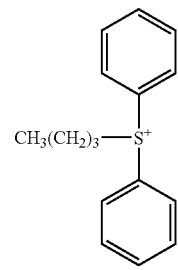 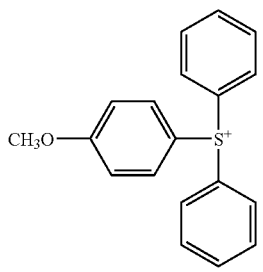 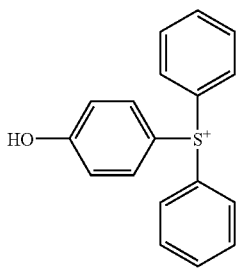
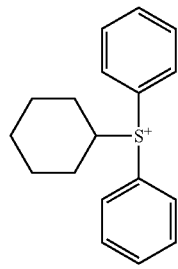 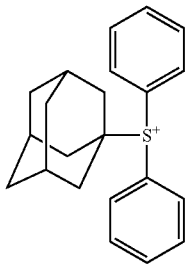 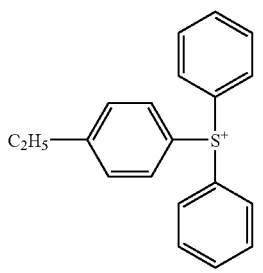
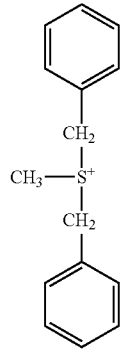 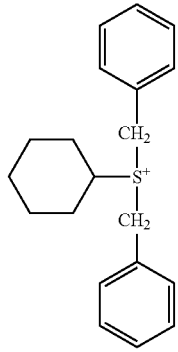 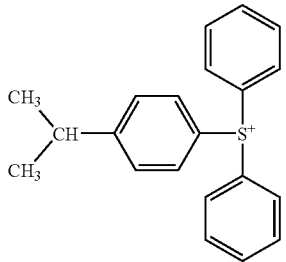
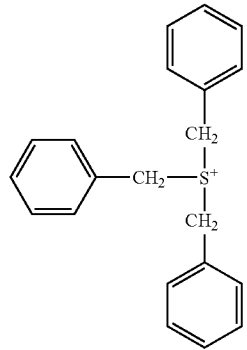 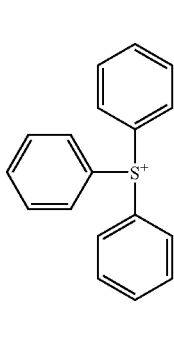 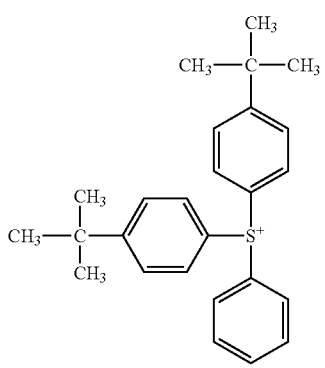
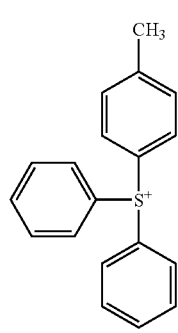 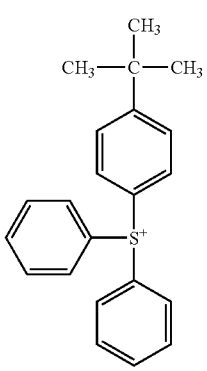 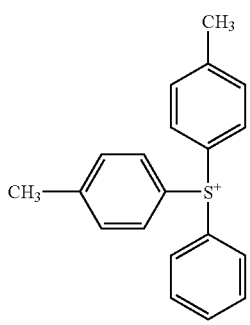 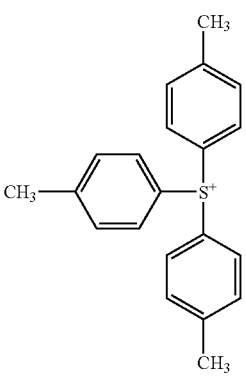

-continued
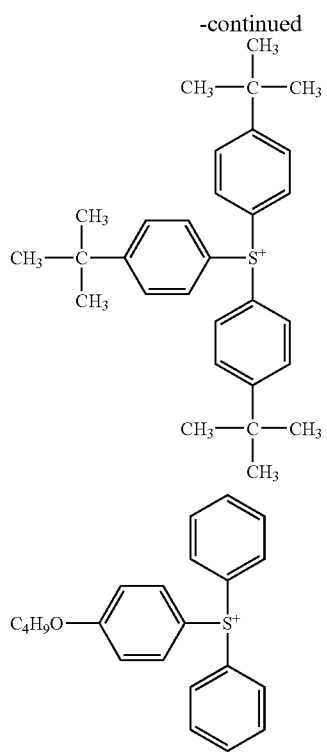
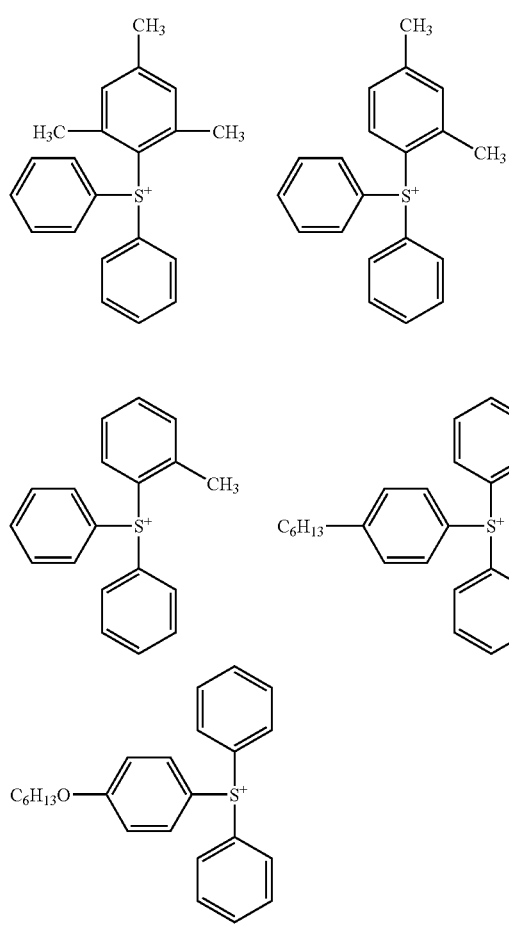
-continued
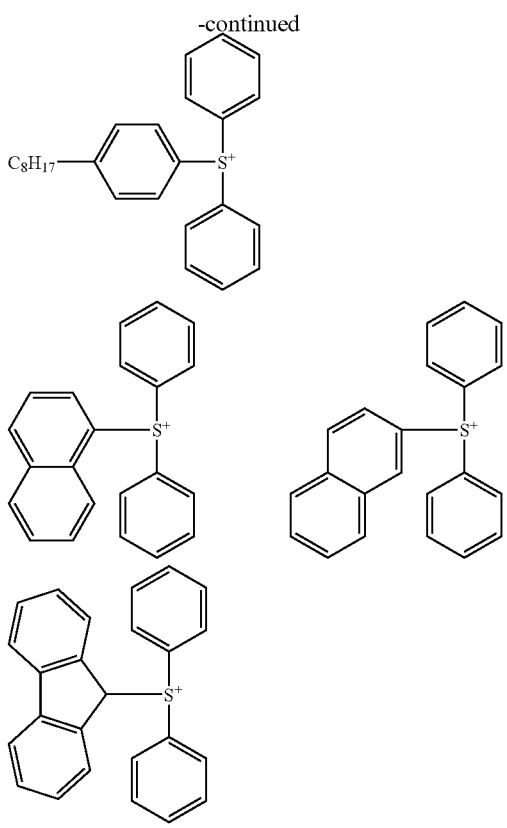
Examples of the cation represented by the formula (VIIIb) include the followings.
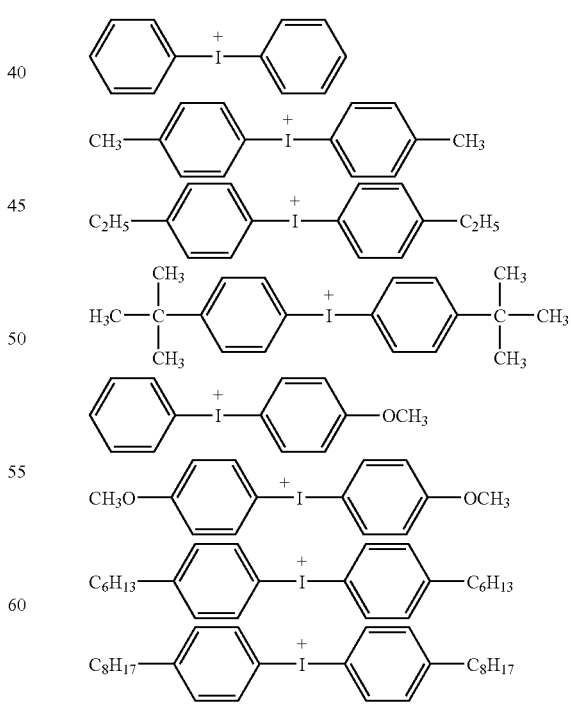
Examples of the cation represented by the formula (VIIIc) include the followings.

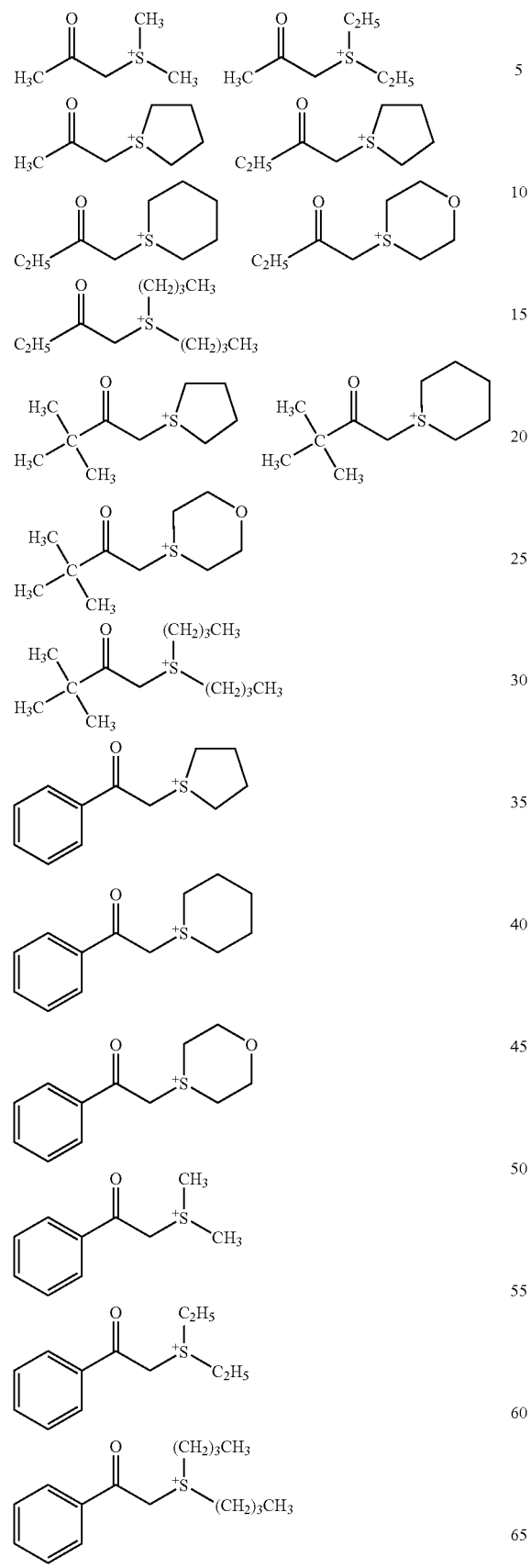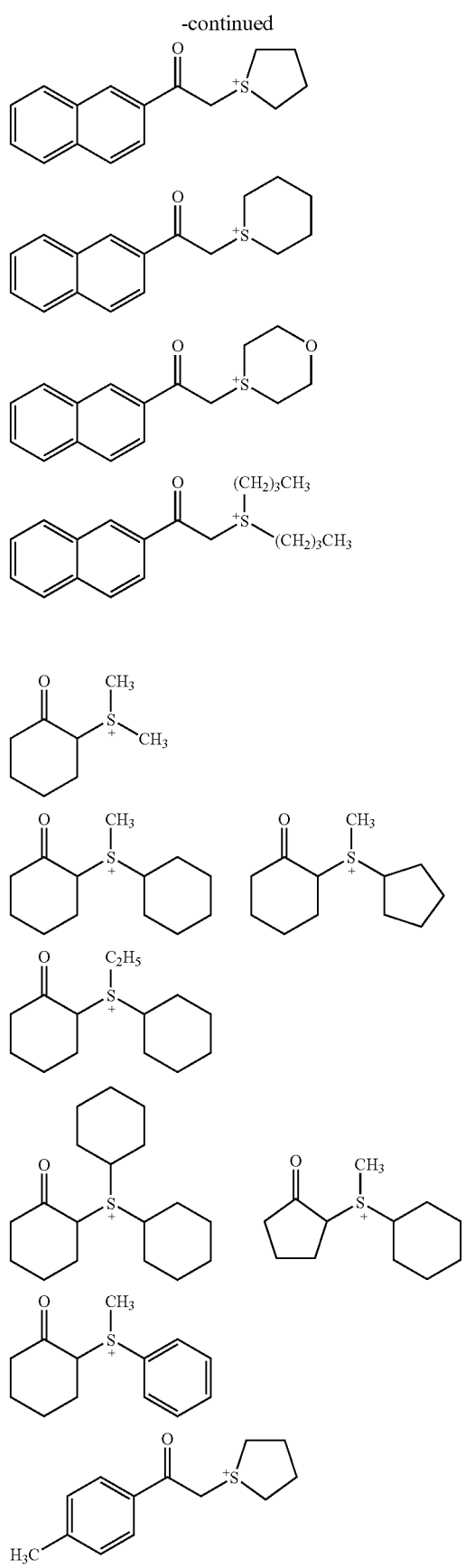

-continued
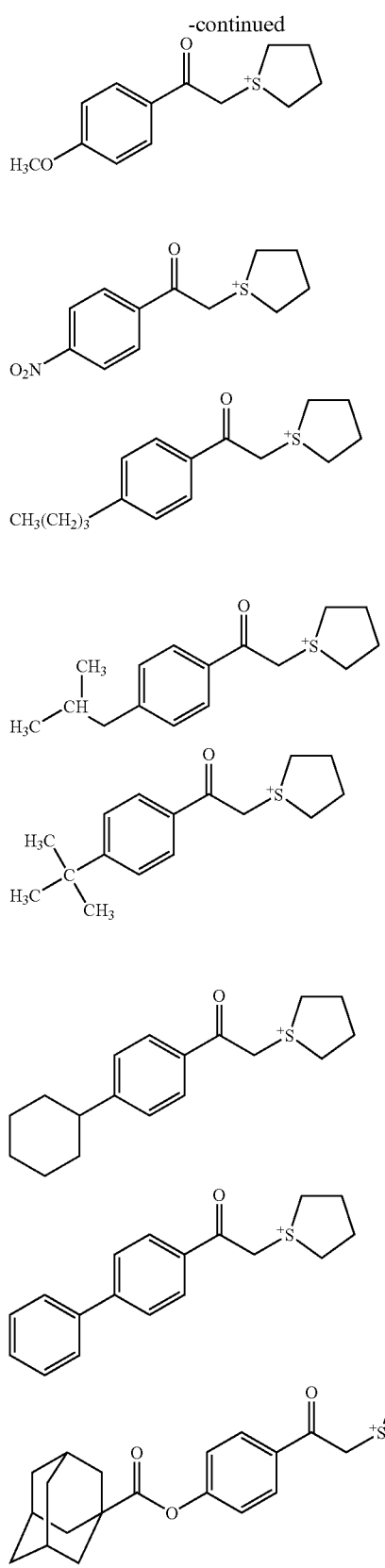
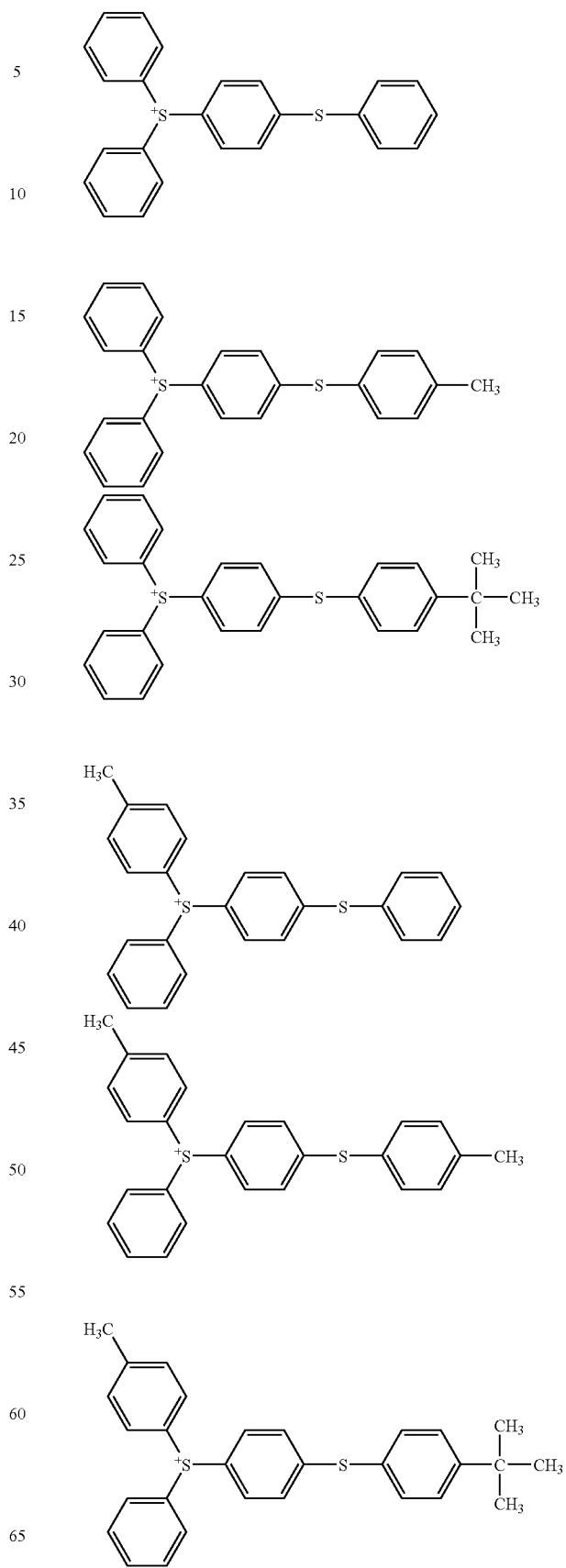
Examples of the cation represented by the formula (VIIId) include the followings.

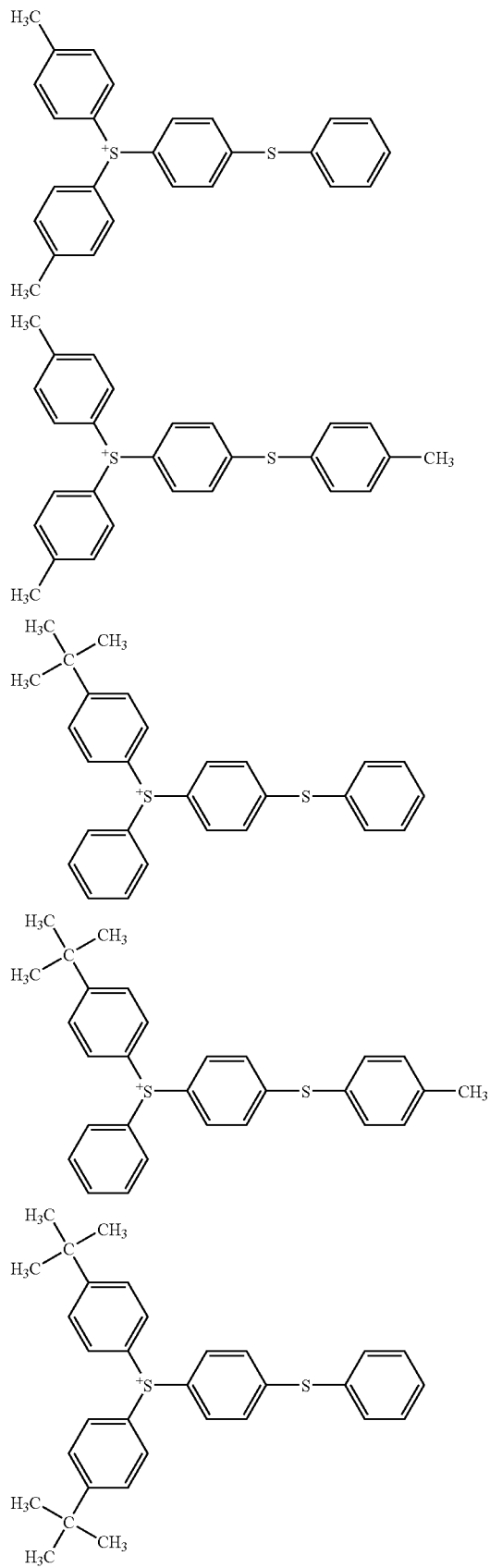
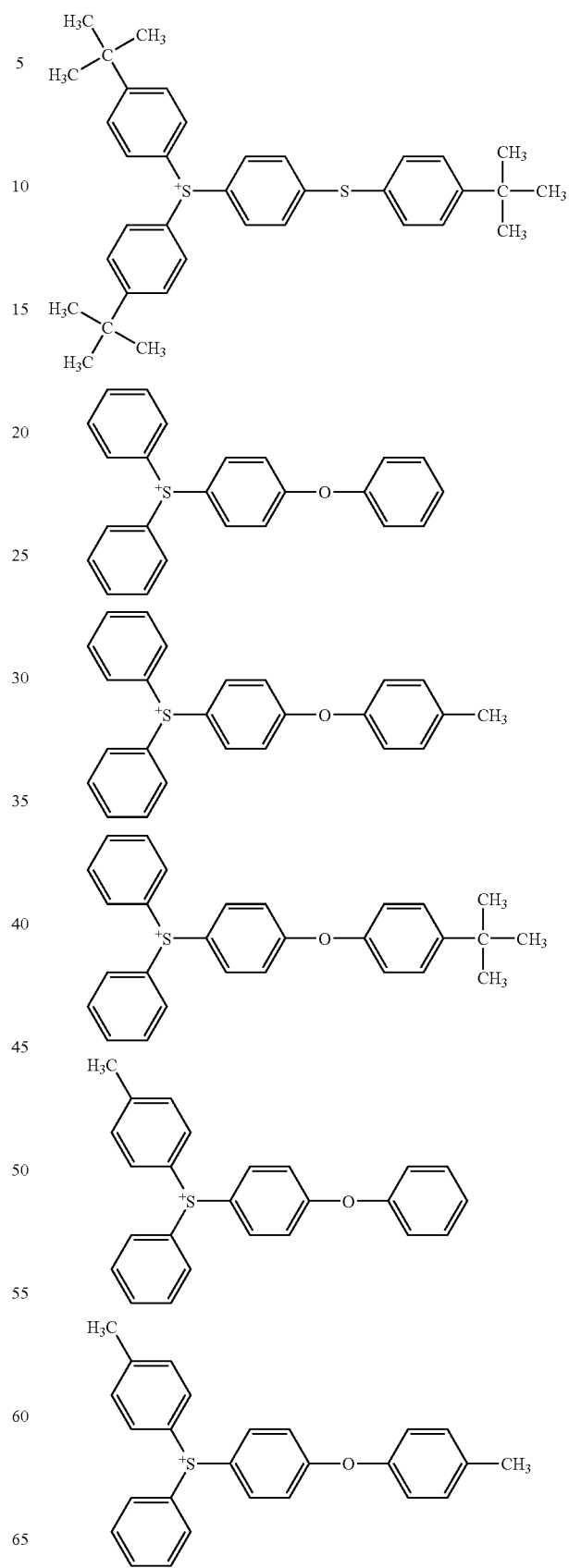

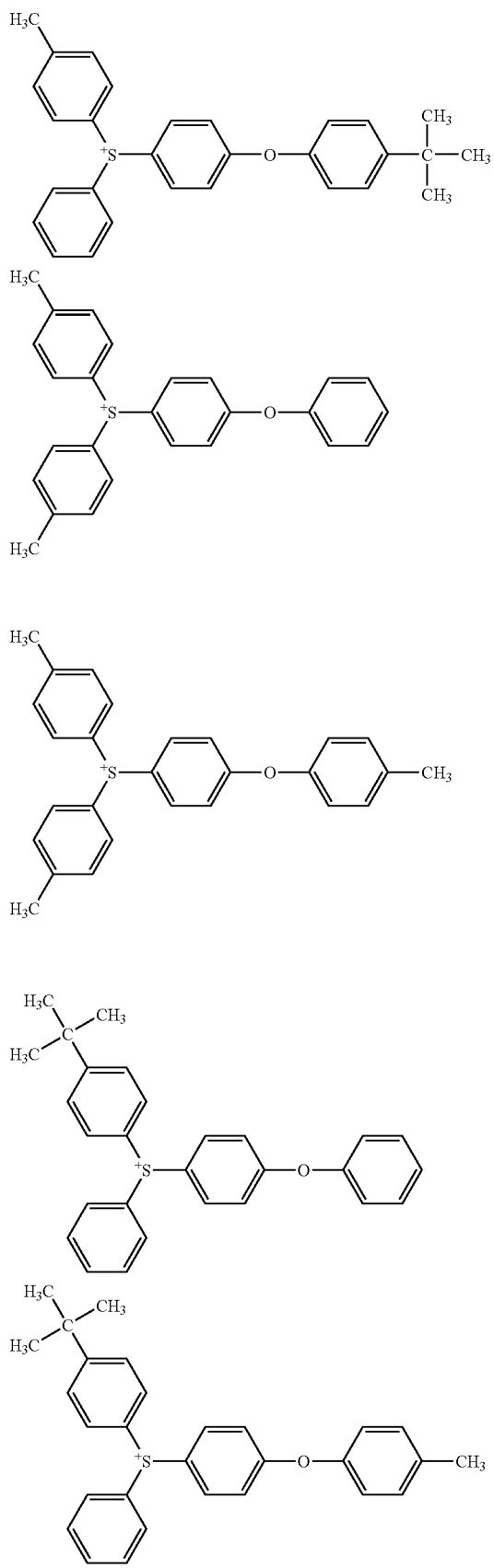
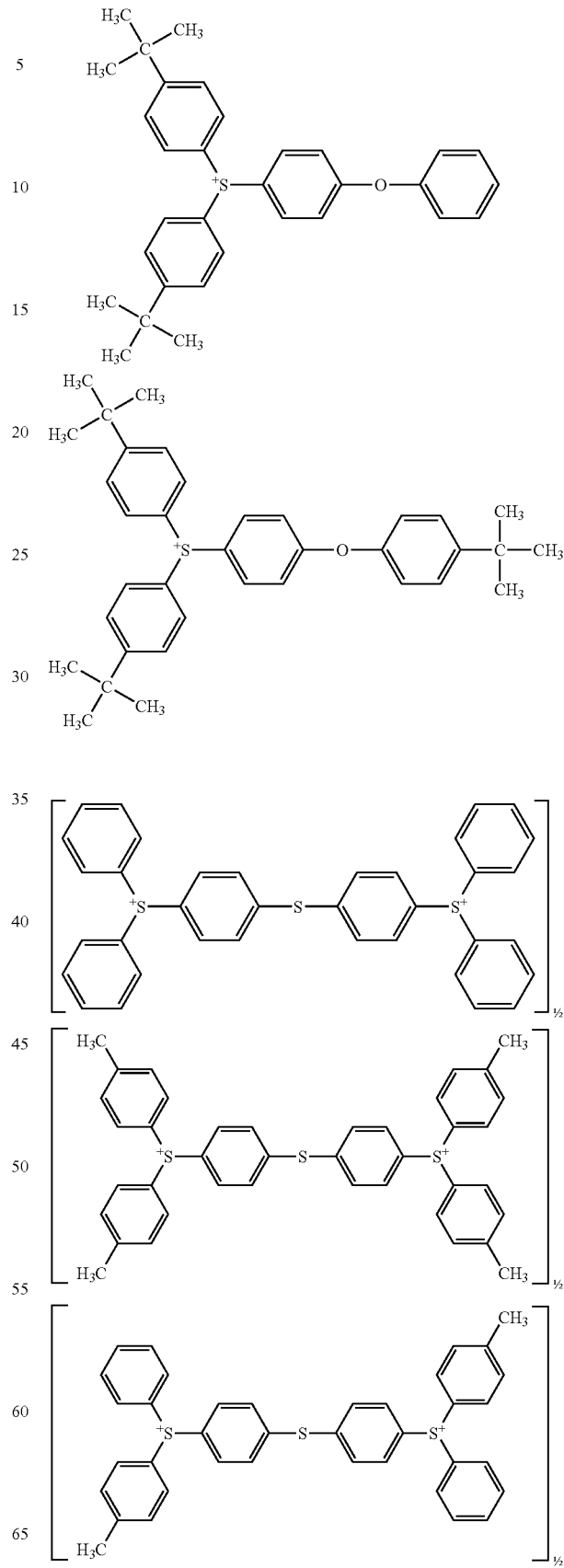

-continued
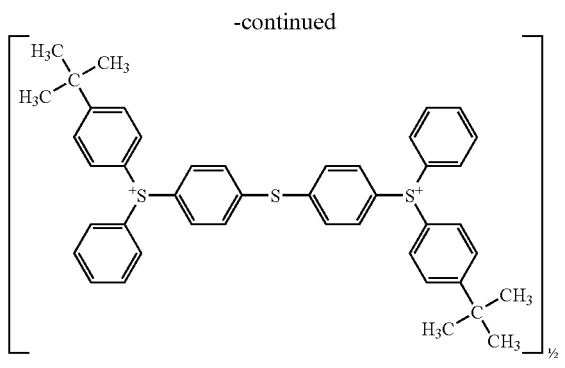
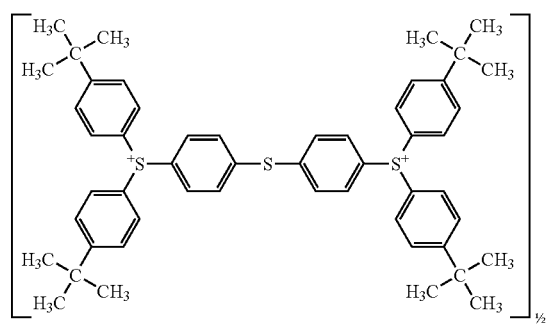
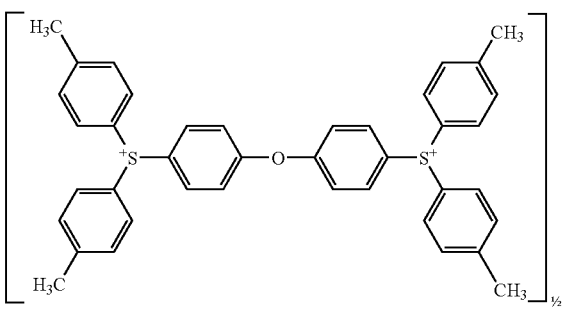
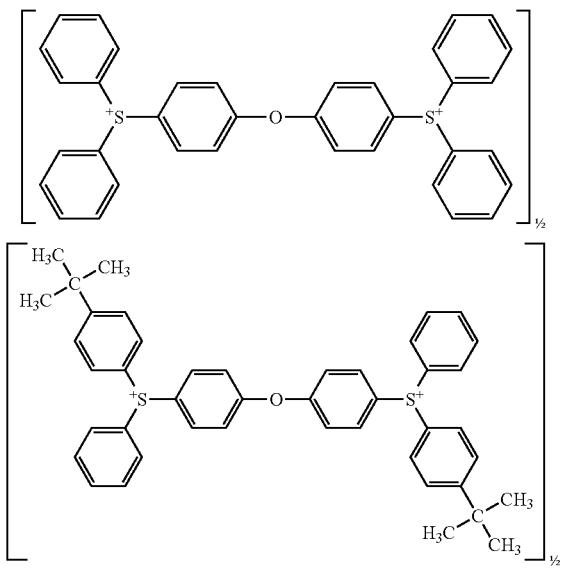
-continued
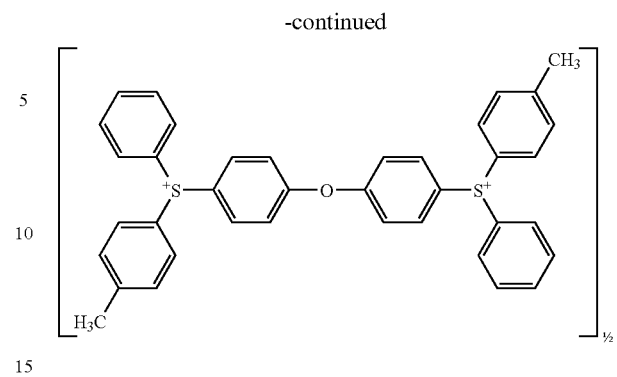
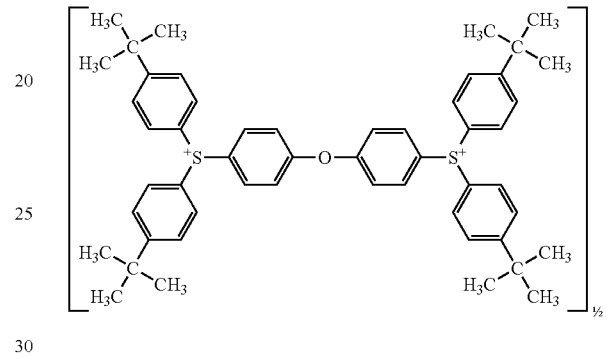
Examples of the salt represented by the formula (I) include the followings.
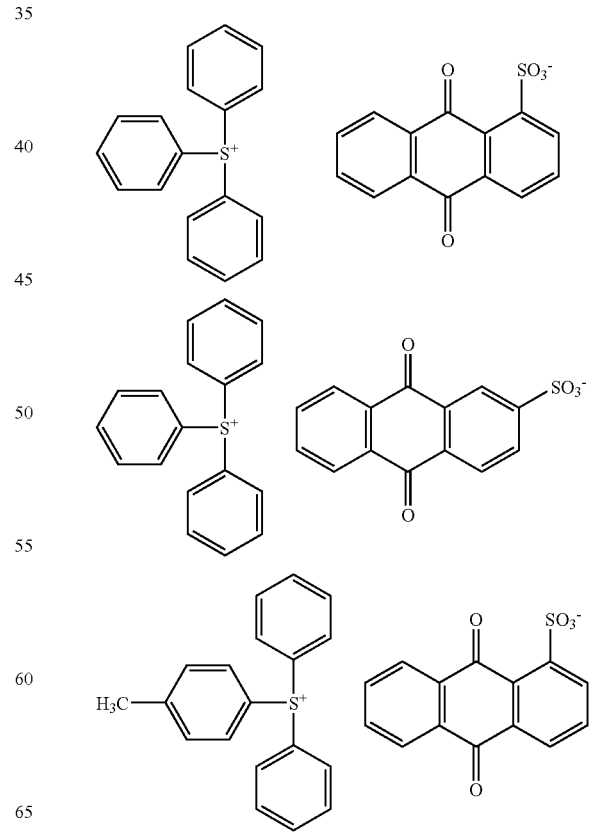

-continued
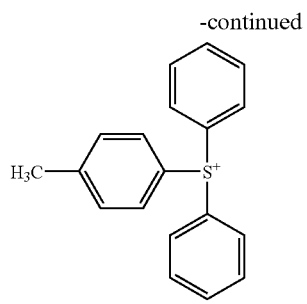
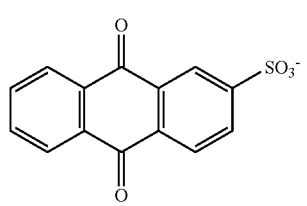
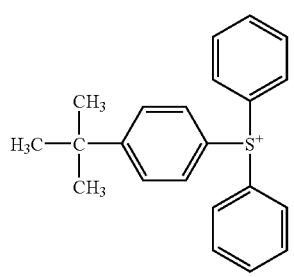
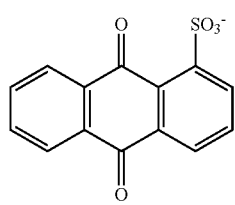
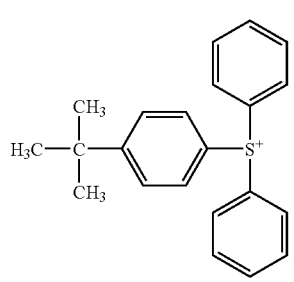
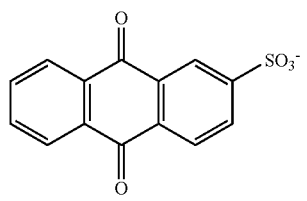
-continued
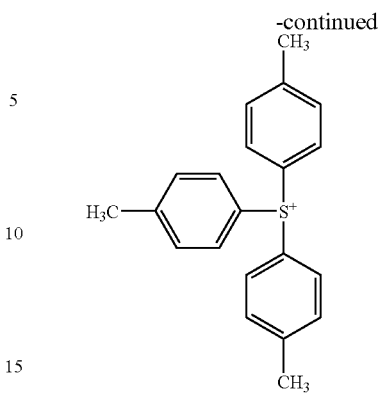
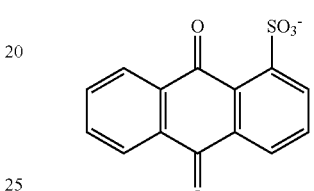
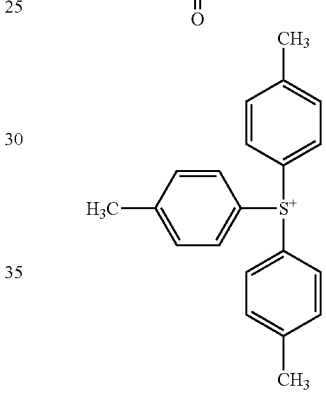
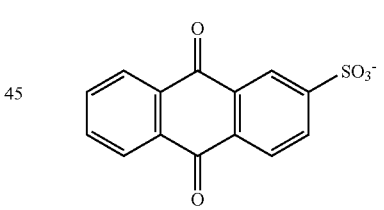
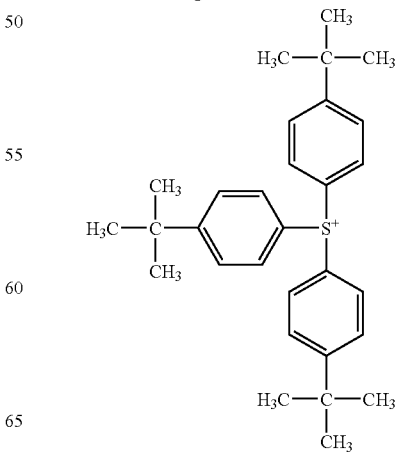

-continued
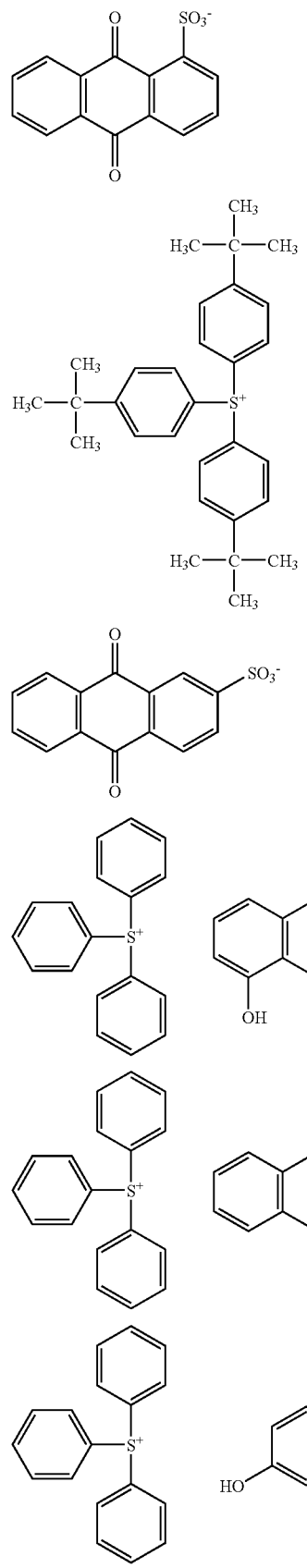
-continued
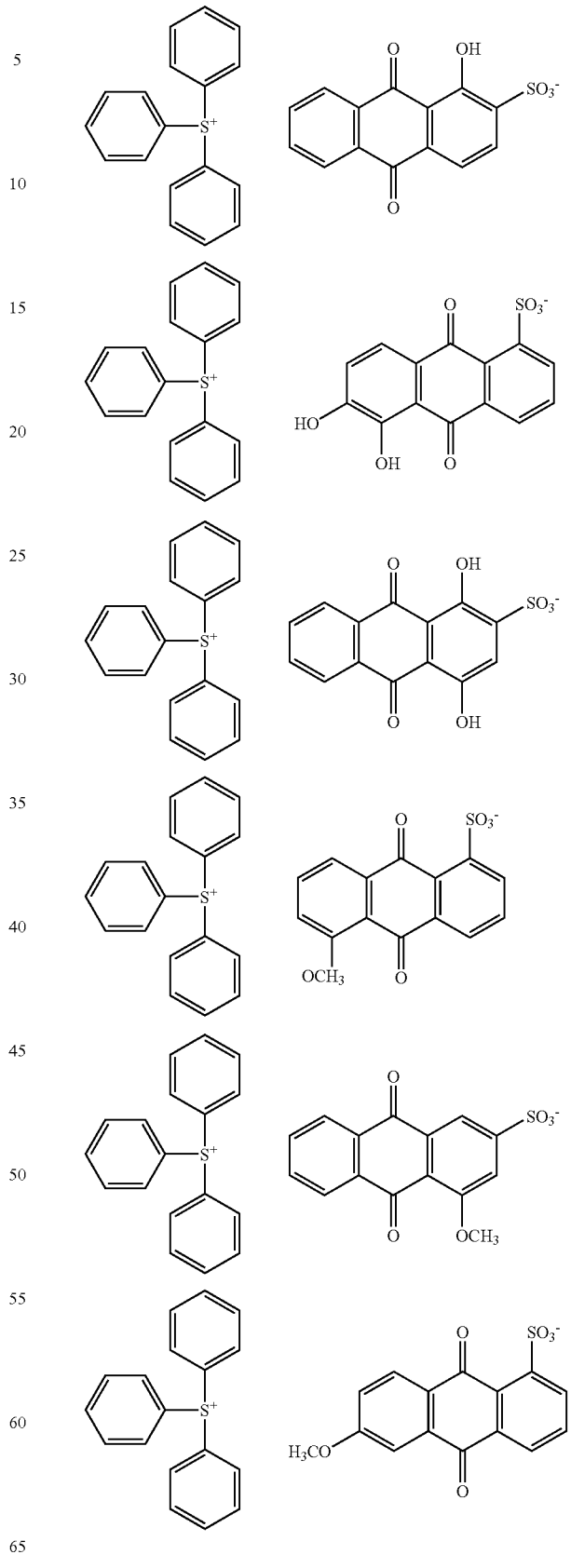

-continued
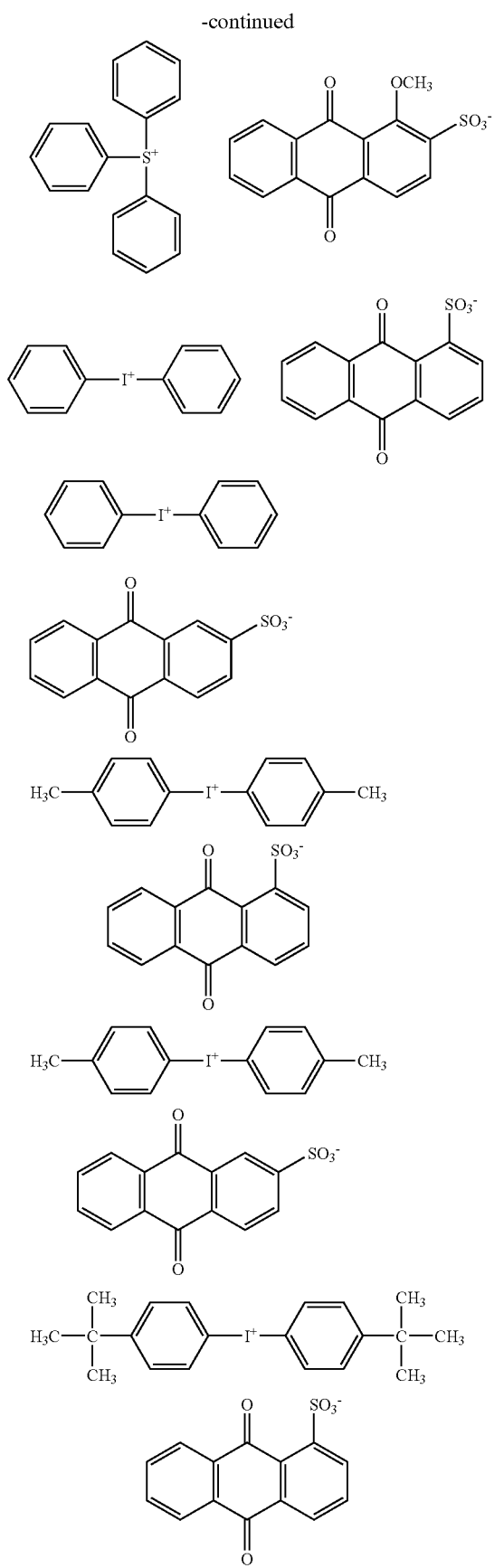
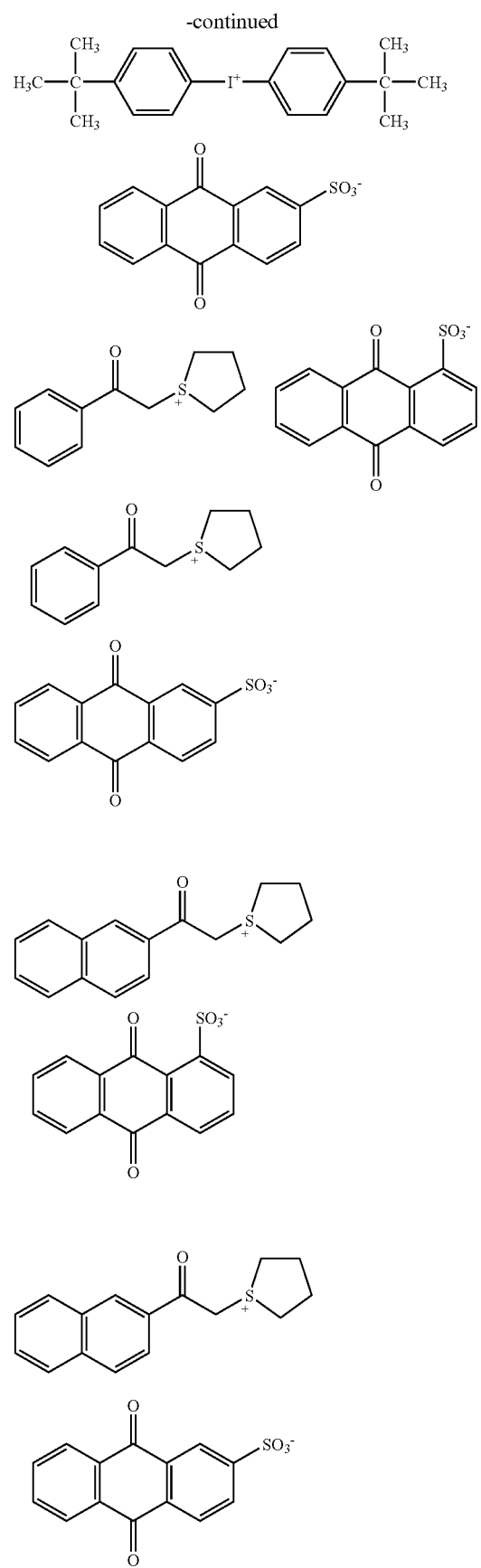

-continued

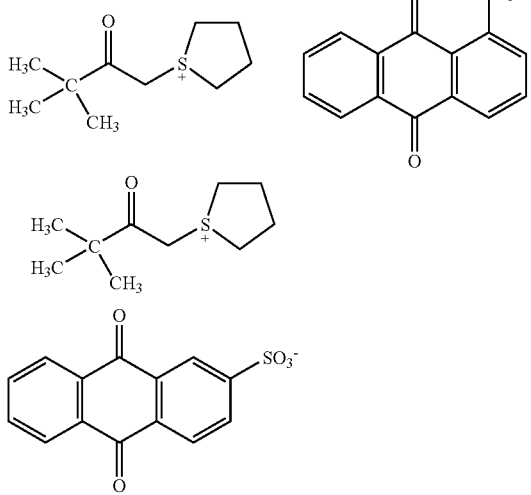

The salt represented by the formula (I) can be produced by reacting of a salt represented by the formula (Ia):

wherein R is the same as defined above and M represents Li, Na, K or Ag, with a compound represented by the formula (Ib):

$$A^+Z^-  \quad (Ib)$$

wherein $A^+$ is the same as defined above and Z represents F, Cl, Br, I, $BF_4$, $AsF_6$, $SbF_6$, $PF_6$ or $ClO_4$, in an inert solvent such as acetonitrile, water, methanol, chloroform and dichloromethane, at a temperature of 0 to 150° C., preferably of 0 to 100° C.

As the compound (Ib), commercially available one is usually used.

The used amount of the compound (Ib) is usually 0.5 to 2 moles per 1 mole of the salt represented by the formula (Ia). The salt represented by the formula (I) obtained may be taken out by crystallization or washing with water.

The salt represented by the formula (I) is an acid generator, and the acid generator generates an acid by irradiation to itself or the composition containing the same, and the acid generated catalytically acts against a resin (B), and the resin (B) become soluble in an aqueous alkali solution.

The present chemically amplified positive resist composition further comprises the other acid generator.

Examples of the other acid generator include an onium salt, a halogenated alkyltriazine compound, a diazomethane compound having a sulfonyl group, sulfonate compound and an imide compound having a sulfonyloxy group. The onium salt is preferable.

The present chemically amplified positive resist composition preferably comprises at least one an acid generator selected from the group consisting of an onium salt, a halogenated alkyltriazine compound, a diazomethane compound having a sulfonyl group, a sulfonate compound and an imide compound having a sulfonyloxy group, in addition to the salt represented by the formula (I), and more preferably comprises an onium salt in addition to the salt represented by the formula (I)

Examples of the onium salt include the salts represented by the formula (X):

$$A^+{}^-O_3S-R^{23} \quad (X)$$

wherein $R^{23}$ represents a linear or branched chain perfluoroalkyl group, or an aryl group which may be substituted, and $A^+$ represents the same meaning as defined above.

Examples of the linear or branched chain perfluoroalkyl group include a C1-C20 perfluoroalkyl group such as a trifluoromethyl group, a pentafluoroethyl group, a heptafluoropropyl group, a nonafluorobutyl group and a perfluorooctyl group.

Examples of the aryl group include a C6-C20 aryl group such as a phenyl group, a naphthyl group and an anthryl group. Examples of the substituent of the aryl group include a C1-C20 alkyl group, a C1-C20 alkoxy group and a halogen atom.

Examples of the C1-C20 alkyl group include a methyl group, an ethyl group, an n-propyl group, an isopropyl group, an n-butyl group, a tert-butyl group, an n-pentyl group, an n-hexyl group, an n-octyl group, an n-decyl group, an n-dodecyl group and an n-hexadecyl group.

Examples of the C1-C20 alkoxy group include a methoxy group, an ethoxy group, an n-propoxy group, an isopropoxy group, an n-butoxy group, a tert-butoxy group, an n-pentyloxy group, an n-hexyloxy group, an isopentyloxy group, an n-decyloxy group, an n-dodecyloxy group and an n-hexadecyloxy group.

Examples of the halogen atom include a fluorine, chlorine, bromine and iodine atom.

As $R^{23}$, the linear or branched chain C1-C8 perfluoroalkyl group and the phenyl group which may be substituted with at least one group selected from a C1-C20 alkyl group and a halogen atom are preferable.

Examples of the anion part of the salt represented by the formula (X) include the followings:

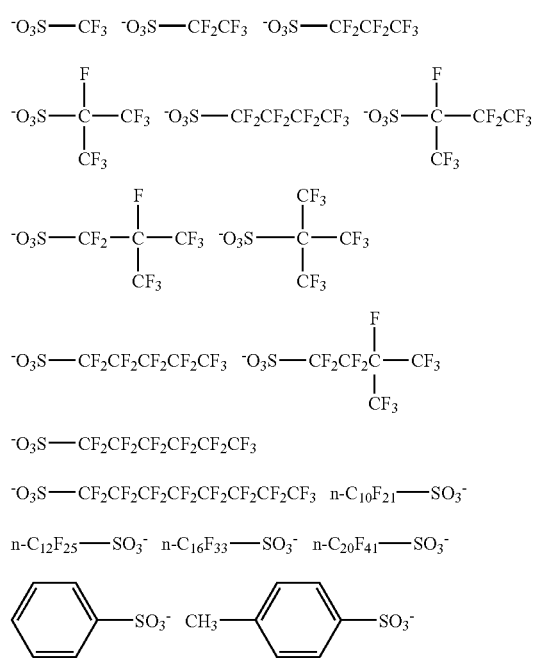

-continued

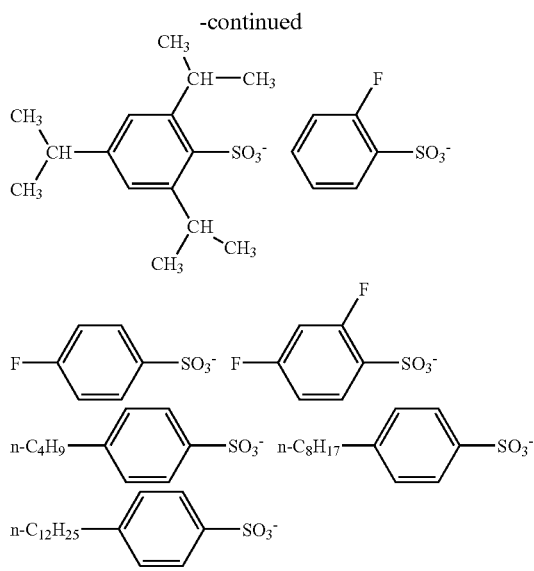

Examples of the onium salt represented by the formula (X) include triphenylsulfonium trifluoromethanesulfonate, triphenylsulfonium perfluorobutanesulfonate, triphenylsulfonium perfluorooctanesulfonate, 4-methylphenyldiphenylsulfonium trifluoromethanesulfonate, 4-methylphenyldiphenylsulfonium perfluorobutanesulfonate, 4-methylphenyldiphenylsulfonium perfluorooctanesulfonate, 4-hydroxyphenyldiphenylsulfonium perfluorobutanesulfonate, 4-hydroxyphenyldiphenylsulfonium perfluorooctanesulfonate, 4-methoxyphenyldiphenylsulfonium perfluorobutanesulfonate, 4-methoxyphenyldiphenylsulfonium perfluorooctanesulfonate, tris(4-methylphenyl)sulfonium perfluorobutanesulfonate, tris(4-methylphenyl)sulfonium perfluorooctanesulfonate, tris(4-methoxyphenyl)sulfonium perfluorobutanesulfonate, tris(4-methoxyphenyl)sulfonium perfluorooctanesulfonate, 2,4,6-trimethylphenyldiphenylsulfonium trifluoromethanesulfonate, 4-tert-butylphenyldiphenylsulfonium trifluoromethanesulfonate, diphenyliodonium trifluoromethanesulfonate, diphenyliodonium perfluorobutanesulfonate, 4-methoxyphenylphenyliodonium trifluoromethanesulfonate, di(4-methoxyphenyl)iodonium perfluorooctanesulfonate, di(4-tert-butylphenyl)iodonium trifluoromethanesulfonate, di(4-tert-butylphenyl)iodonium perfluorooctanesulfonate, triphenylsulfonium benzenesulfonate, triphenylsulfonium p-toluenesulfonate, triphenylsulfonium triisopropylbenzenesulfonate, triphenylsulfonium 2-fluorobenzenesulfonate, triphenylsulfonium 4-fluorobenzenesulfonate, triphenylsulfonium 2,4-difluorobenzenesulfonate, triphenylsulfonium 4-(n-butyl)benzenesulfonate, triphenylsulfonium 4-(n-octyl)benzenesulfonate, triphenylsulfonium 4-(n-dodecyl)benzenesulfonate, 4-methylphenyldiphenylsulfonium benzenesulfonate, 4-methylphenyldiphenylsulfonium p-toluenesulfonate, 4-methylphenyldiphenylsulfonium triisopropylbenzenesulfonate, 4-methylphenyldiphenylsulfonium 2-fluorobenzenesulfonate, 4-methylphenyldiphenylsulfonium 4-fluorobenzenesulfonate, 4-methylphenyldiphenylsulfonium 2,4-difluorobenzenesulfonate, 4-methylphenyldiphenylsulfonium 4-(n-butyl)benzenesulfonate, 4-methylphenyldiphenylsulfonium 4-(n-octyl)benzenesulfonate, 4-methylphenyldiphenylsulfonium 4-(n-dodecyl)benzenesulfonate, tris(4-methylphenyl)sulfonium benzenesulfonate, tris(4-methylphenyl)sulfonium p-toluene-sulfonate, tris(4-methylphenyl)sulfonium triisopropylbenzenesulfonate, tris(4-methylphenyl)sulfonium 2-fluorobenzenesulfonate, tris(4-methylphenyl)sulfonium 4-fluorobenzenesulfonate, tris(4-methylphenyl)sulfonium 2,4-difluorobenzenesulfonate, tris(4-methylphenyl)sulfonium 4-(n-butyl)benzenesulfonate, tris(4-methylphenyl)sulfonium 4-(n-octyl)benzenesulfonate, tris(4-methylphenyl)sulfonium 4-(n-dodecyl)benzenesulfonate, 4-hydroxyphenyldiphenylsulfonium benzenesulfonate, 4-methoxyphenyldiphenylsulfonium benzenesulfonate, 4-methoxyphenyldiphenylsulfonium p-toluenesulfonate, 4-methoxyphenyldiphenylsulfonium triisopropylbenzenesulfonate, 4-methoxyphenyldiphenylsulfonium 2-fluorobenzenesulfonate, 4-methoxyphenyldiphenylsulfonium 4-fluorobenzenesulfonate, 4-methoxyphenyldiphenylsulfonium 2,4-difluorobenzenesulfonate, 4-methoxyphenyldiphenylsulfonium 4-(n-butyl)benzenesulfonate, 4-methoxyphenyldiphenylsulfonium 4-(n-octyl)benzenesulfonate, 4-methoxyphenyldiphenylsulfonium 4-(n-dodecyl)benzenesulfonate, tris(4-methoxyphenyl)sulfonium benzenesulfonate, tris(4-methoxyphenyl)sulfonium p-toluenesulfonate, tris(4-methoxyphenyl)sulfonium triisopropylbenzenesulfonate, tris(4-methoxyphenyl)sulfonium 2-fluorobenzenesulfonate, tris(4-methoxyphenyl)sulfonium 4-fluorobenzenesulfonate, tris(4-methoxyphenyl)sulfonium 2,4-difluorobenzenesulfonate, tris(4-methoxyphenyl)sulfonium 4-(n-butyl)benzenesulfonate, tris(4-methoxyphenyl)sulfonium 4-(n-octyl)benzenesulfonate, tris(4-methoxyphenyl)sulfonium 4-(n-dodecyl)benzenesulfonate, diphenyliodonium p-toluenesulfonate, di(4-methoxyphenyl)iodonium p-toluenesulfonate, di(4-tert-butylphenyl)iodonium benzenesulfonate, di(4-tert-butylphenyl)iodonium p-toluenesulfonate, di(4-tert-butylphenyl)iodonium triisopropylbenzenesulfonate, di(4-tert-butylphenyl)iodonium 2,4,6-triisopropyl-3-nitrobenzenesulfonate, di(4-tert-butylphenyl)iodonium 2-fluorobenzenesulfonate, di(4-tert-butylphenyl)iodonium 4-fluorobenzenesulfonate, di(4-tert-butylphenyl)iodonium 4-(n-butyl)benzenesulfonate, di(4-tert-butylphenyl)iodonium 4-(n-octyl)benzenesulfonate and di(4-tert-butylphenyl)iodonium 4-(n-dodecyl)benzenesulfonate.

Examples of the halogenated alkyltriazine compound include 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzo[d][1,3]dioxoran-5-yl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis(trichloromethyl)-1,3,5-triazine, 2-(3,4-dimethoxystyryl)-4,6-bis(trichloromethyl)-1,3,5-triazine, 2-(2,4-methoxystyryl)-4,6-bis(trichloromethyl)-1,3,5-triazine, 2-(2-methoxystyryl)-4,6-bis(trichloromethyl)-1,3,5-triazine, 2-(4-butoxystyryl)-4,6-bis(trichloromethyl)-1,3,5-triazine and 2-(4-pentyloxystyryl)-4,6-bis(trichloromethyl)-1,3,5-triazine.

Examples of the sulfonate compound include 1-benzoyl-1-phenylmethyl p-toluenesulfonate (generally called "benzoin tosylate"), 2-benzoyl-2-hydroxy-2-phenylethyl p-toluenesulfonate (generally called "α-methylolbenzoin tosylate"), 1,2,3-benzene-tri-yl tris(methanesulfonate), 2,6-dinitrobenzyl p-toluenesulfonate, 2-nitrobenzyl p-toluenesulfonate and 4-nitrobenzyl p-toluenesulfonate.

Examples of the imide compound having a sulfonyloxy group include N-(ethylsulfonyloxy)succinimide, N-(isopropylsulfonyloxy)succinimide, N-(butylsulfonyloxy)succinimide, N-(hexylsulfonyloxy)succinimide, N-(trifluoromethylsulfonyloxy)succinimide, N-(chloromethylsulfonyloxy)succinimide, N-(cyclohexylmethylsulfonyloxy)succinimide, N-(benzylsulfonyloxy)succinimide, N-(phenylsulfonyloxy)succinimide, N-(p-tolylsulfonyloxy)succinimide, N-(o-tolylsulfonyloxy)succinimide, N-(2,5-xylylsulfonyloxy)succinimide, N-(4-ethylphenylsulfonyloxy)succinimide, N-(2,4,6-trimethylphenylsulfonyloxy)succinimide, N-(2,4,6-triisopropylphenylsulfonyloxy)succinimide, N-(4-methoxyphenylsulfonyloxy)succinimide, N-(4-chlorphenylsulfonyloxy)succinimide, N-(2,4,5-trichlorophenylsulfonyloxy)succinimide, N-(2-nitrophenylsulfonyloxy)succinimide, N-(4-nitrophenylsulfonyloxy)succinimide, N-(4-methoxy-2-nitrophenylsulfonyloxy)succinimide, N-(1-naphthylsulfonyloxy)succinimide, N-(10-camphorsulfonyloxy)succinimide, N-(trifluoromethylsulfonyloxy)phthalimide, N-(trifluoromethylsulfonyloxy)-5-norbornene-2,3-dicarboxyimide, N-(trifluoromethylsulfonyloxy)naphthalimide and N-(10-camphorsulfonyloxy)naphthalimide.

Examples of the diazomethane compound having a sulfonyl group include a compound represented by the formula (IX):

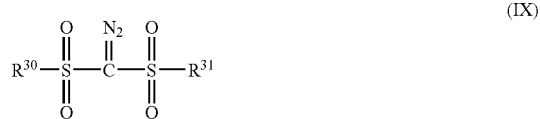

wherein $R^{30}$ and $R^{31}$ independently represents a C3-C8 linear, branched chain or cyclic alkyl group or an aryl group which may be substituted.

Examples of the C3-C8 linear, branched chain or cyclic alkyl group include an n-propyl group, an isopropyl group, an n-butyl group, an isobutyl group, a tert-butyl group, an n-pentyl group, an n-hexyl group, an n-octyl group, a cyclopentyl group and a cyclohexyl group.

Examples of the substitutent of the aryl group include a halogen atom such as a fluorine atom, a chlorine atom and a bromine atom.

Examples of the aryl group which may be substituted include a phenyl group, a 4-chlorophenyl group, a p-tolyl group, a 2,4-xylyl group, a 4-isopropylphenyl group, a 4-tert-butylphenyl group, a naphthyl group and an anthryl group.

Examples of the compound represented by the formula (IX) include bis(n-propylsulfonyl)diazomethane, bis(isopropylsulfonyl)diazomethane, bis(n-butylsulfonyl)diazomethane, bis(tert-butylsulfonyl)diazomethane, bis(cyclopentylsulfonyl)diazomethane, bis(cyclohexylsulfonyl)diazomethane, bis(phenylsulfonyl)diazomethane, bis(4-chlorophenylsulfonyl)diazomethane, bis(p-tolylsulfonyl)diazomethane, bis(4-tert-butylphenylsulfonyl)diazomethane, bis(2,4-xylylsulfonyl)diazomethane, bis(4-isopropylphenylsulfonyl)diazomethane, bis(naphthylsulfonyl)diazomethane, and bis(anthrylsulfonyl)diazomethane.

Among them, bis(cyclohexylsulfonyl)diazomethane and bis(tert-butylsulfonyl)diazomethane are preferable.

Next, the resin (B) will be illustrated.

The resin (B) contains a structural unit having an acid-labile group. The resin (B) itself is insoluble or poorly soluble in an aqueous alkali solution but becomes soluble in an aqueous alkali solution by the action of an acid. The acid generator generates an acid by irradiation to itself or the composition containing the same, and the acid generated catalytically acts against the resin (B) in the present positive resist composition, and the acid-labile group cleave by an acid and the resin (B) becomes soluble in an aqueous alkali solution.

In the present specification, "—COOR" may be described as "a structure having ester of carboxylic acid", and may also be abbreviated as "ester group". Specifically, "—COOC$(CH_3)_3$" may be described as "a structure having tert-butyl ester of carboxylic acid", or be abbreviated as "tert-butyl ester group".

Examples of the acid-labile group include a structure having ester of carboxylic acid such as alkyl ester group in which a carbon atom adjacent to the oxygen atom is quaternary carbon atom, alicyclic ester group in which a carbon atom adjacent to the oxygen atom is quaternary carbon atom, and a lactone ester group in which a carbon atom adjacent to the oxygen atom is quaternary carbon atom. The "quaternary carbon atom" means a "carbon atom joined to four substituents other than hydrogen atom".

Examples of the acid-labile group include an alkyl ester group in which a carbon atom adjacent to the oxygen atom is quaternary carbon atom such as a tert-butyl ester group; an acetal type ester group such as a methoxymethyl ester, ethoxymethyl ester, 1-ethoxyethyl ester, 1-isobutoxyethyl ester, 1-isopropoxyethyl ester, 1-ethoxypropoxy ester, 1-(2-methoxyethoxy)ethyl ester, 1-(2-acetoxyethoxy)ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester group; an alicyclic ester group in which a carbon atom adjacent to the oxygen atom is quaternary carbon atom, such as an isobornyl ester, 1-alkylcycloalkyl ester, 2-alkyl-2-adamantyl ester and 1-(1-adamantyl)-1-alkylalkyl ester group. At least one hydrogen atom in the adamantyl group may be substituted with a hydroxyl group.

Examples of the structural unit include a structure unit derived from an ester of acrylic acid, a structural unit derived from an ester of methacrylic acid, a structural unit derived from an ester of norbornenecarboxylic acid, a structural unit derived from an ester of tricyclodecenecarboxylic acid and a structural unit derived from an ester of tetracyclodecenecarboxylic acid. The structure units derived from the ester of acrylic acid and from the ester of methacrylic acid are preferable.

The resin (B) can be obtained by conducting polymerization reaction of a monomer or monomers having the acid-labile group and an olefinic double bond.

Among the monomers, those having a bulky and acid-labile group such as an alicyclic ester group (e.g. a 2-alkyl-2-adamantyl ester and 1-(1-adamantyl)-1-alkylalkyl ester group), since excellent resolution is obtained when the resin obtained is used in the present composition.

Examples of such monomer containing the bulky and acid-labile group include a 2-alkyl-2-adamantyl acrylate, a 2-alkyl-2-adamantyl methacrylate, 1-(1-adamantyl)-1-alkylalkyl acrylate, a 1-(1-adamantyl)-1-alkylalkyl methacrylate, a 2-alkyl-2-adamantyl 5-norbornene-2-carboxylate, a 1-(1-adamantyl)-1-alkylalkyl 5-norbornene-2-carboxylate, a 2-alkyl-2-adamantyl α-chloroacrylate and a 1-(1-adamantyl)-1-alkylalkyl α-chloroacrylate.

Particularly when the 2-alkyl-2-adamantyl acrylate, the 2-alkyl-2-adamantyl methacrylate or the 2-alkyl-2-adamantyl α-chloroacrylate is used as the monomer for the resin component in the present composition, a resist composition having excellent resolution tend to be obtained. Typical examples thereof include 2-methyl-2-adamantyl acrylate, 2-methyl-2-adamantyl methacrylate, 2-ethyl-2-adamantyl acrylate, 2-ethyl-2-adamantyl methacrylate, 2-n-butyl-2-adamantyl acrylate, 2-methyl-2-adamantyl α-chloroacrylate and 2-ethyl-2-adamantyl α-chloroacrylate. When particularly 2-ethyl-2-adamantyl acrylate, 2-ethyl-2-adamantyl methacrylate, 2-isopropyl-2-adamantyl acrylate or 2-isopropyl-2-adamantyl methacrylate is used for the present positive resist composition, a resist composition having excellent sensitivity and heat resistance tends to be obtained. In the present invention, two or more kinds of monomers having a group or groups dissociated by the action of the acid may be used together, if necessary.

The 2-alkyl-2-adamantyl acrylate can be usually produced by reacting a 2-alkyl-2-adamantanol or a metal salt thereof with an acrylic halide, and the 2-alkyl-2-adamantyl methacrylate can be usually produced by reacting a 2-alkyl-2-adamantanol or a metal salt thereof with a methacrylic halide.

The resin used for the present positive resist composition can also contain other structural unit or units derived from an acid-stable monomer in addition to the above-mentioned structural units having the acid-labile group. Herein, the "structural unit derived from an acid-stable monomer" means "a structural unit not dissociated by an acid generated from the acid generator".

Examples of such other structural unit derived from the acid-stable monomer include a structural unit derived from a monomer having a free carboxyl group such as acrylic acid and methacrylic acid; a structural unit derived from an aliphatic unsaturated dicarboxylic anhydride such as maleic anhydride and itaconic anhydride; a structural unit derived from 2-norbornene; a structural unit derived from acrylonitrile or methacrylonitrile; a structural unit derived from an alkyl acrylate or an alkyl methacrylate in which a carbon atom adjacent to oxygen atom is secondary or tertiary carbon atom; a structural unit derived from 1-adamantyl acrylate or 1-adamantyl methacrylate; a structural unit derived from styrene monomer such as p-hydroxystyrene and m-hydroxystyrene; a structural unit derived from acryloyloxy-γ-butyrolactone or methacryloyloxy-γ-butyrolactone having a lactone ring which may be substituted with an alkyl group; and the like. Herein, the 1-adamantyloxycarbonyl group is the acid-stable group though the carbon atom adjacent to oxygen atom is the quaternary carbon atom, and the 1-adamantyloxycarbonyl group may be substituted with at least one hydroxyl group.

Specific examples of the structural unit derived from the acid-stable monomer include a structural unit derived from 3-hydroxy-1-adamantyl acrylate;

a structural unit derived from 3-hydroxy-1-adamantyl methacrylate;

a structural unit derived from 3,5-dihydroxy-1-adamantyl acrylate;

a structural unit derived from 3,5-dihydroxy-1-adamantyl methacrylate;

a structural unit derived from α-acryloyloxy-γ-butyrolactone;

a structural unit derived from α-methacryloyloxy-γ-butyrolactone;

a structural unit derived from β-acryloyloxy-γ-butyrolactone;

a structural unit derived from β-methacryloyloxy-γ-butyrolactone;

a structural unit derived from p-hydroxystyrene;

a structural unit derived from m-hydroxystyrene;

a structural unit derived from an alicyclic compound having an olefinic double bond such as a structural unit represented by the following formula:

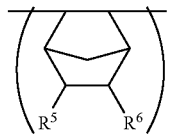

wherein $R^5$ and $R^6$ each independently represents a hydrogen atom, a C1-C3 alkyl group, a C1-C3 hydroxyalkyl group, a carboxyl group, a cyano group or a —COOU group in which U represents an alcohol residue, or $R^5$ and $R^6$ can be bonded together to form a carboxylic anhydride residue represented by —C(=O)OC(=O)—;

a structural unit derived from an aliphatic unsaturated dicarboxylic anhydride such as a structural unit represented by the following formula:

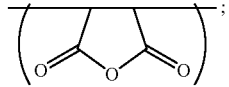

a structural unit represented by the following formula:

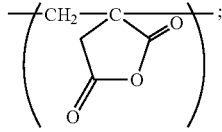

and the like.

A lactone ring of the acryloyloxy-γ-butyrolactone and the methacryloyloxy-γ-butyrolactone may be substituted with the alkyl group.

Particularly, the resin having further at least one structural unit selected from the structural unit derived from p-hydroxystyrene, the structural unit derived from m-hydroxystyrene, the structural unit derived from styrene, the structural unit derived from acyloxystyrene, the structural unit derived from 3-hydroxy-1-adamantyl acrylate, the structural unit derived from 3-hydroxy-1-adamantyl methacrylate, the structural unit derived from 3,5-dihydroxy-1-adamantyl acrylate, the structural unit derived from 3,5-dihydroxy-1-adamantyl methacrylate, a structural unit derived from α-acryloyloxy-γ-butyrolactone, a structural unit derived from α-methacryloyloxy-γ-butyrolactone, a structural unit derived from β-acryloyloxy-γ-butyrolactone and a structural unit derived from β-methacryloyloxy-γ-butyrolactone in addition to the structural unit having the acid-labile group is preferable from the standpoint of the adhesiveness of resist to a substrate and resolution of resist.

3-Hydroxy-1-adamantyl acrylate, 3-hydroxy-1-adamantyl methacrylate, 3,5-dihydroxy-1-adamantyl acrylate and 3,5-dihydroxy-1-adamantyl methacrylate can be produced, for example, by reacting corresponding hydroxyadamantane with acrylic acid, methacrylic acid or its acid halide, and they are also commercially available.

Further, the acryloyloxy-γ-butyrolactone and the methacryloyloxy-γ-butyrolactone having the lactone ring which may be substituted with the alkyl group can be produced by reacting corresponding α- or β-bromo-γ-butyrolactone with acrylic acid or methacrylic acid, or reacting corresponding α- or β-hydroxy-γ-butyrolactone with the acrylic halide or the methacrylic halide.

Examples of the acryloyloxy-γ-butyrolactone and the methacryloyloxy-γ-butyrolactone having the lactone ring which may be substituted with the alkyl group include α-acryloyloxy-γ-butyrolactone, α-methacryloyloxy-γ-butyrolactone, α-acryloyloxy-β,β-dimethyl-γ-butyrolactone, α-methacryloyloxy-β,β-dimethyl-γ-butyrolactone, α-acryloyloxy-α-methyl-γ-butyrolactone, α-methacryloyloxy-α-methyl-γ-butyrolactone, β-acryloyloxy-γ-butyrolactone, β-methacryloyloxy-γ-butyrolactone and β-methacryloyloxy-α-methyl-γ-butyrolactone.

Examples of the structural unit derived from acyloxystyrene include a structural unit derived from 4-benzoyloxystyrene.

Examples of the resin having the structural unit derived from hydroxystyrene and the structural unit having an acid-labile group include the followings.

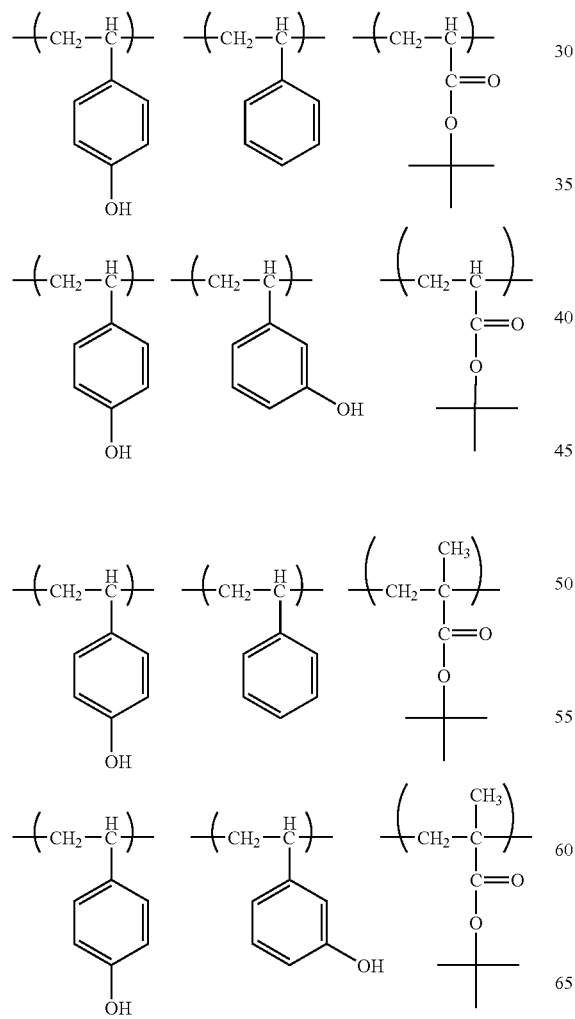

-continued

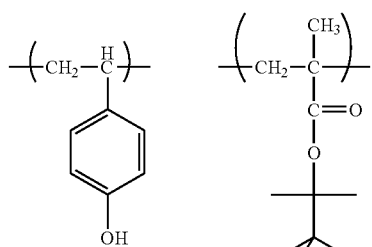

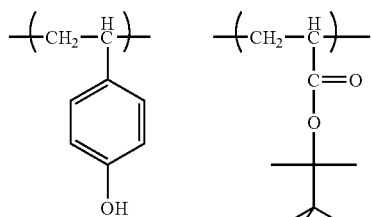

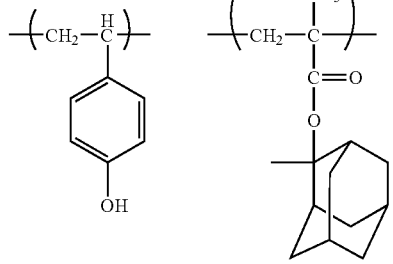

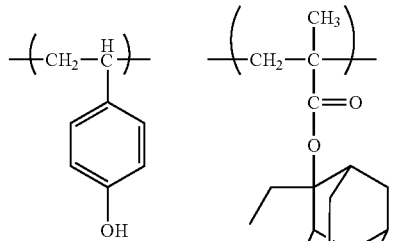

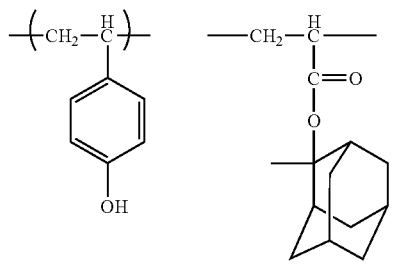

-continued

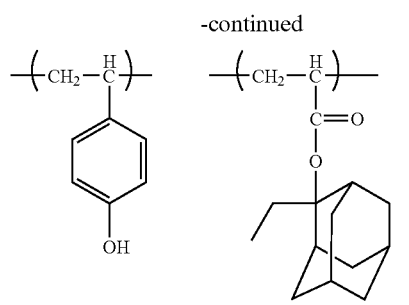

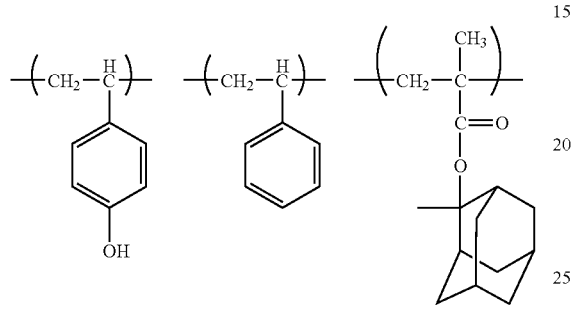

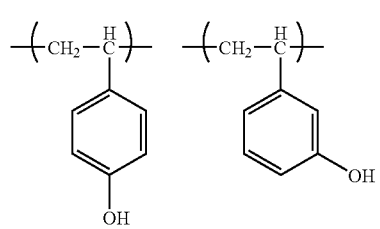

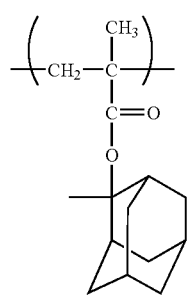

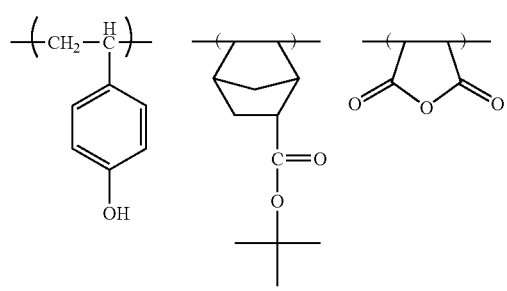

-continued

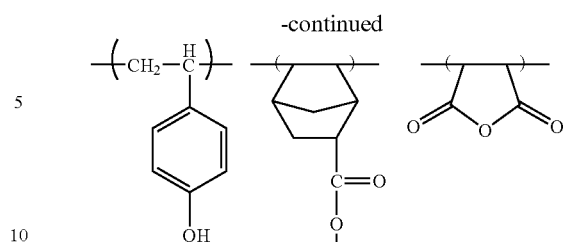

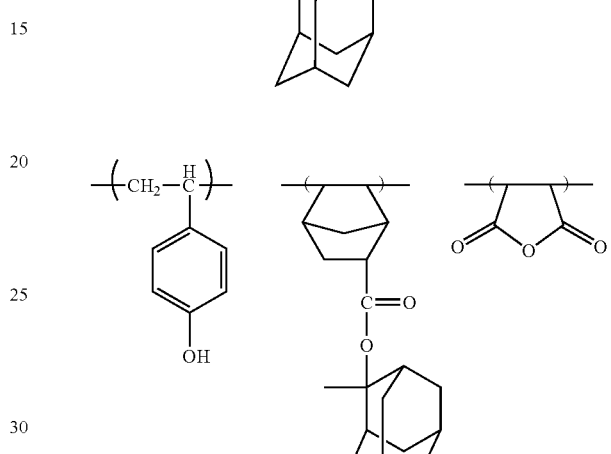

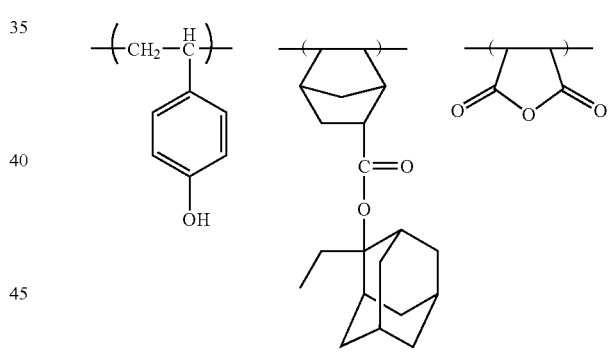

For obtaining such copolymerization resins, the corresponding acrylic or methacrylic ester monomer can be radical-polymerized with acetoxystyrene and styrene, and then the acetoxy group in the structure unit derived from acetoxystyrene can be de-acetylated with an acid.

In $R^5$ and $R^6$, examples of the C1-C3 alkyl group include a methyl, ethyl, and n-propyl group, and examples of the C1-C3 hydroxyalkyl group include a hydroxymethyl and 2-hydroxyethyl group.

In $R^5$ and $R^6$, the —COOU group is an ester formed from the carboxyl group, and as the alcohol residue corresponding to U, for example, an optionally substituted C1-C8 alkyl group, 2-oxooxolan-3-yl group, 2-oxooxolan-4-yl and the like are listed, and as the substituent on the C1-C8 alkyl group, a hydroxyl group, an alicyclic hydrocarbon residue and the like are listed.

Specific examples of the monomer used to give the structural unit represented by the above-mentioned formula:

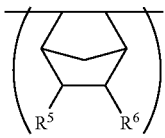

may include 2-norbornene, 2-hydroxy-5-norbornene, 5-norbornene-2-carboxylic acid, methyl 5-norbornene-2-carboxylate, 2-hydroxyethyl 5-norbornene-2-carboxylate, 5-norbornene-2-methanol and 5-norbornene-2,3-dicarboxylic anhydride.

When U in the —COOU group is the acid-labile group, the structural unit represented by the above-mentioned formula is a structural unit having the acid-labile group even if it has the norbornene structure. Examples of monomers giving structural unit having the acid-labile group include tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl)ethyl 5-norbornene-2-carboxylate, 1-(1-adamantyl)-1-methylethyl 5-norbornene-2-carboxylate, and the like.

The resin used in the present positive resist composition preferably contains the structural unit or units having the acid-labile group generally in a ratio of 5 to 80% by mole in all structural units of the resin though the ratio varies depending on the kind of radiation for patterning exposure, the kind of the acid-labile group, and the like.

When the structural units particularly derived from the 2-alkyl-2-adamantyl acrylate, the 2-alkyl-2-adamantyl methacrylate, the 1-(1-adamantyl)-1-alkylalkyl acrylate or the 1-(1-adamantyl)-1-alkylalkyl methacrylate are used as the structural unit having the acid-labile group, it is advantageous in dry-etching resistance of the resist that the ratio of the structural units is 10% by mole or more in all structural units of the resin.

When, in addition to structural units having the acid-labile group, other structural units having the acid-stable group are contained in the resin, it is preferable that the sum of these structural units is in the range of 20 to 95% by mole based on all structural units of the resin.

The resin used for the present positive resist composition can be produced by conducting polymerization reaction of the corresponding monomer or monomers. The resin can be also produced by conducting oligomerization of the corresponding monomer or monomers followed by polymerizing the oligomer obtained.

The polymerization reaction is usually carried out in the presence of a radical initiator.

The radical initiator is not limited and examples thereof include an azo compound such as 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl-2,2'-azobis(2-methylpropionate) and 2,2'-azobis(2-hydroxymethylpropionitrile); an organic hydroperoxide such as lauroyl peroxide, tert-butyl hydroperoxide, benzoyl peroxide, tert-butyl peroxybenzoate, cumene hydroperoxide, diisopropyl peroxydicarbonate, di-n-propyl peroxydicarbonate, tert-butyl peroxyneodecanoate, tert-butyl peroxypivalate and 3,5,5-trimethylhexanoyl peroxide; and an inorganic peroxide such as potassium peroxodisulfate, ammonium peroxodisulfate and hydrogen peroxide. Among them, the azo compound is preferable and 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile) and dimethyl-2,2'-azobis(2-methylpropionate) are more preferable, and 2,2'-azobisisobutyronitrile and 2,2'-azobis(2,4-dimethylvaleronitrile) are especially preferable.

These radical initiators may be used alone or in a form of a mixture of two or more kinds thereof. When the mixture of two or more kinds thereof is used, the mixed ratio is not particularly limited.

The amount of the radical initiator is preferably 1 to 20% by mole based on all monomer or oligomer molar amount.

The polymerization temperature is usually 0 to 150° C., and preferably 40 to 100° C.

The polymerization reaction is usually carried out in the presence of a solvent and it is preferred to use a solvent which is sufficient to dissolve the monomer, the radical initiator and the resin obtained. Examples thereof include a hydrocarbon solvent such as toluene; an ether solvent such as 1,4-dioxane and tetrahydrofuran; a ketone solvent such as methyl isobutyl ketone; an alcohol solvent such as isopropyl alcohol; a cyclic ester solvent such as γ-butyrolactone; a glycol ether ester ester solvent such as propylene glycol monomethyl ether acetate; and an acyclic ester solvent such as ethyl lactate. These solvents may be used alone and a mixture thereof may be used.

The amount of the solvent is not limited, and practically, it is preferably 1 to 5 parts by weight relative to 1 part of all monomers or oligomers.

When an alicyclic compound having an olefinic double bond and an aliphatic unsaturated dicarboxylic anhydride are used as monomers, it is preferable to use them in excess amount in view of a tendency that these are not easily polymerized.

After competition of the polymerization reaction, the resin produced can be isolated, for example, by adding a solvent in which the present resin is insoluble or poorly soluble to the reaction mixture obtained and filtering the precipitated resin. If necessary, the isolated resin may be purified, for example, by washing with a suitable solvent.

It is preferable that the present positive resist composition contains the resin (B) in an amount of about 80 to 99.9% by weight and the acid generator in an amount of 0.1 to 20% by weight on the total amount of the resin (B) and the acid generator.

The present positive resist composition, performance deterioration caused by inactivation of acid which occurs due to post exposure delay can be diminished by adding an organic base compound, particularly a nitrogen-containing organic base compound as a quencher.

Specific examples of the nitrogen-containing organic base compound include an amine compound represented by the following formulae:

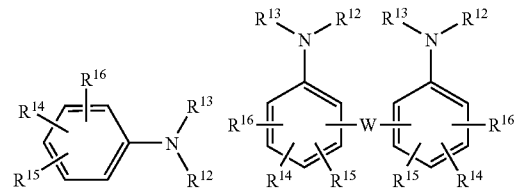

-continued

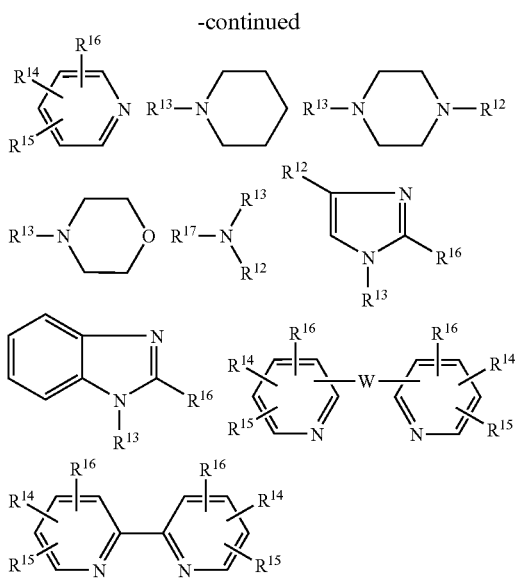

wherein $R^{12}$ and $R^{13}$ independently represent a hydrogen atom, an alkyl group, a cycloalkyl group or an aryl group, and the alkyl, cycloalkyl and aryl group may be substituted with at least one group selected from a hydroxyl group, an amino group which may be substituted with a C1-C4 alkyl group and a C1-C6 alkoxy group which may be substituted with a C1-C6 alkoxy group, $R^{14}$ and $R^{15}$ independently represent a hydrogen atom, an alkyl group, a cycloalkyl group, an aryl group or an alkoxy group, and the alkyl, cycloalkyl, aryl and alkoxy group may be substituted with at least one group selected from a hydroxyl group, an amino group which may be substituted with a C1-C4 alkyl group and a C1-C6 alkoxy group, or $R^{14}$ and $R^{15}$ bond together with the carbon atoms to which they bond to form an aromatic ring, $R^{16}$ represent a hydrogen atom, an alkyl group, a cycloalkyl group, an aryl group, an alkoxy group or a nitro group, and the alkyl, cycloalkyl, aryl and alkoxy group which may be substituted with at least one group selected from a hydroxyl group, an amino group which may be substituted with a C1-C4 alkyl group and a C1-C6 alkoxy group, $R^{17}$ represents an alkyl or cycloalkyl group, and the alkyl and cycloalkyl group may be substituted with at least one group selected from a hydroxyl group, an amino group which may be substituted with a C1-C4 alkyl group and a C1-C6 alkoxy group, and W represents —CO—, —NH—, —S—, —S—S—, an alkylene group of which at least one methylene group may be replaced with —O—, or an alkenylene group of which at least one methylene group may be replaced with —O—, and a quaternary ammonium hydroxide represented by the following formula:

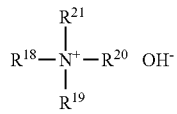

wherein $R^{18}$, $R^{19}$, $R^{20}$ and $R^{21}$ independently represent an alkyl group, a cycloalkyl group or an aryl group, and the alkyl, cycloalkyl and aryl group may be substituted with at least one group selected from a hydroxyl group, an amino group which may be substituted with a C1-C4 alkyl group and a C1-C6 alkoxy group.

The alkyl group in $R^{12}$, $R^{13}$, $R^{14}$, $R^{15}$, $R^{16}$, $R^{17}$, $R^{18}$, $R^{19}$, $R^{20}$ and $R^{21}$ preferably has about 1 to 10 carbon atoms, and more preferably has about 1 to 6 carbon atoms.

Examples of the amino group which may be substituted with the C1-C4 alkyl group include an amino, methylamino, ethylamino, n-butylamino, dimethylamino and diethylamino group. Examples of the C1-C6 alkoxy group which may be substituted with the C1-C6 alkoxy group include a methoxy, ethoxy, n-propoxy, isopropoxy, n-butoxy, tert-butoxy, n-pentyloxy, n-hexyloxy and 2-methoxyethoxy group.

Specific examples of the alkyl group which may be substituted with at least one group selected from a hydroxyl group, an amino group which may be substituted with a C1-C4 alkyl group, and a C1-C6 alkoxy group which may be substituted with a C1-C6 alkoxy group include a methyl, ethyl, n-propyl, isopropyl, n-butyl, tert-butyl, n-pentyl, n-hexyl, n-octyl, n-nonyl, n-decyl, 2-(2-methoxyethoxy)ethyl, 2-hydroxyethyl, 2-hydroxypropyl, 2-aminoethyl, 4-aminobutyl and 6-aminohexyl group.

The cycloalkyl group in $R^{12}$, $R^{13}$, $R^{14}$, $R^{15}$, $R^{16}$, $R^{17}$, $R^{18}$, $R^{19}$, $R^{20}$ and $R^{21}$ preferably has about 5 to 10 carbon atoms. Specific examples of the cycloalkyl group which may be substituted with at least one group selected from a hydroxyl group, an amino group which may be substituted with a C1-C4 alkyl group and a C1-C6 alkoxy group include a cyclopentyl, cyclohexyl, cycloheptyl and cyclooctyl group.

The aryl group in $R^{12}$, $R^{13}$, $R^{14}$, $R^{15}$, $R^{17}$, $R^{18}$, $R^{19}$, $R^{20}$ and $R^{21}$ preferably has about 6 to 10 carbon atoms. Specific examples of the aryl group which may be substituted with at least one group selected from a hydroxyl group, an amino group which may be substituted with a C1-C4 alkyl group and a C1-C6 alkoxy group include a phenyl and naphthyl group.

The alkoxy group in $R^{14}$, $R^{15}$ and $R^{16}$ preferably has about 1 to 6 carbon atoms and specific examples thereof include a methoxy, ethoxy, n-propoxy, isopropoxy, n-butoxy, tert-butoxy, n-pentyloxy and n-hexyloxy group.

The alkylene and alkenylene groups in W preferably have 2 to 6 carbon atoms. Specific examples of the alkylene group include an ethylene, trimethylene, tetramethylene, methylenedioxy and ethylene-1,2-dioxy group, and specific examples of the alkenylene group include an ethane-1,2-diyl, 1-propene-1,3-diyl and 2-butene-1,4-diyl group.

Specific examples of the amine compound include n-hexylamine, n-heptylamine, n-octylamine, n-nonylamine, n-decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptyamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecyamine, dicyclohexylmethylamine, tris[2-(2-methoxyethoxy)ethyl]

amine, triisopropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine and 3,3'-dipicolylamine.

Examples of the quaternary ammonium hydroxide include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

A hindered amine compound having a piperidine skelton as disclosed in JP 11-52575 A1 can be also used as the quencher.

In the point of forming patterns having higher resolution, the quaternary ammonium hydroxide is preferably used as the quencher.

When the basic compound is used as the quencher, the present resist composition preferably includes 0.001 to 2% by weight of the basic compound based on the total amount of the resin component, the acid generator and the basic compound.

The present resist composition can contain, if necessary, a small amount of various additives such as a sensitizer, a solution suppressing agent, other polymers, a surfactant, a stabilizer and a dye as long as the effect of the present invention is not prevented.

The present resist composition is usually in the form of a resist liquid composition in which the above-mentioned ingredients are dissolved in a solvent and the resist liquid composition is applied onto a substrate such as a silicon wafer by a conventional process such as spin coating. The solvent used is sufficient to dissolve the above-mentioned ingredients, have an adequate drying rate, and give a uniform and smooth coat after evaporation of the solvent. Solvents generally used in the art can be used.

Examples of the solvent include a glycol ether ester such as ethyl cellosolve acetate, methyl cellosolve acetate and propylene glycol monomethyl ether acetate; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

A resist film applied onto the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended claims, and includes all variations of the equivalent meanings and ranges to the claims.

The present invention will be described more specifically by Examples, which are not construed to limit the scope of the present invention. The "%" and "part(s)" used to represent the content of any component and the amount of any material to be used in the following Examples are on a weight basis unless otherwise specifically noted. The weight-average molecular weight and degree of dispersion (the weight-average molecular weight of the resin obtained/the molar-average molecular weight of the resin obtained) of any resin in the following Examples is a value calculated by a result of gel permeation chromatography analysis using polystyrene as a standard reference material. The structures of obtained compounds were checked by NMR analysis.

Synthesis Example 1

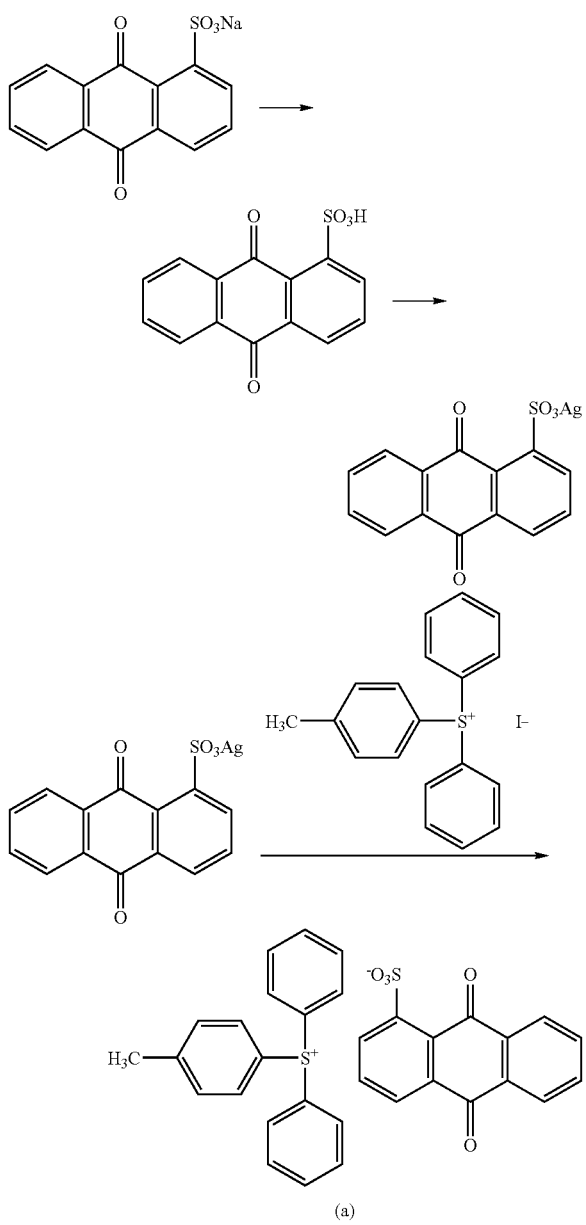

(a)

Five parts of sodium 9,10-anthraquinone-1-sulfonate was dissolved in 400.0 parts of ion-exchanged water at 45° C. The obtained solution was, passed through a column packed with 6.9 parts of an ion-exchanged resin (DUOLITE C20) to obtain a solution containing 9,10-anthraquinone-1-sulfonic acid. To the obtained solution, 2.0 parts' of silver oxide was added and the resultant mixture was stirred over night. The mixture was filtrated to obtain 3.9 parts of silver 9,10-anthraquinone-1-sulfonate.

Three point nine parts of silver 9,10-anthraquinone-1-sulfonate was mixed with 400 parts of methanol. To the resultant mixture, a solution prepared by mixing 4.0 parts of 4-methylphenyldiphenylsulfonium iodide with 40 parts of methanol was added to stir over night. The resultant mixture was filtrated and the filtrate was concentrated. The obtained residue was mixed with 200 parts of chloroform and 50 parts of an ion-exchanged water was added to the obtained mixture. The resultant mixture was separated to obtain the aqueous layer and the organic layer. The organic later obtained was repeated to wash with 50 parts of an ion-exchanged water until the aqueous layer obtained was neutralized. The organic layer obtained was concentrated to obtain 3.8 parts of the salt represented by the above-mentioned formula (a), which is called as B1.

$^1$H-NMR (dimethylsulfoxide-$d_6$, Internal standard: tetramethylsilane): δ (ppm) 2.42 (s, 3H), 7.58 (d, 2H, J=8.1 Hz), 7.70-7.94 (m, 15H), 8.04-8.13 (m, 2H), 8.21 (dd, 1H, J=7.8 Hz, 1.5 Hz), 8.45 (dd, 1H, J=7.8 Hz, 1.3 Hz)

Synthesis Example 2

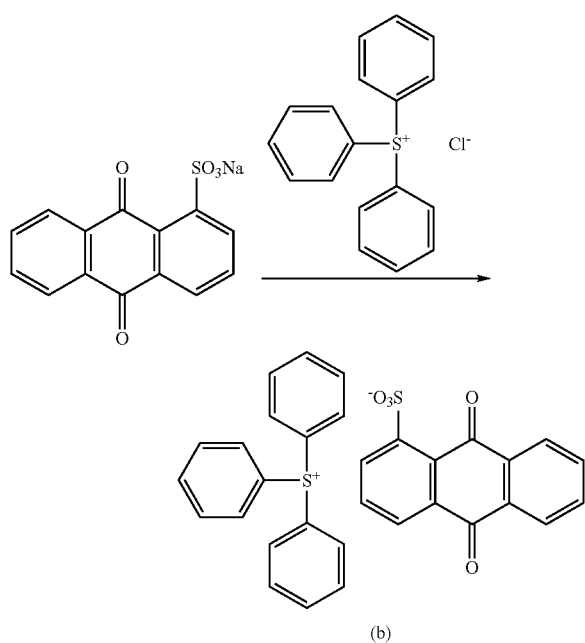

(b)

One thousand parts of methanol, 25.6 parts of sodium 9,10-anthraquinone-1-sulfonate and 232.7 parts of 10.6% by weight aqueous solution of triphenylsulfonium chloride were mixed and the resultant mixture was stirred at 60° C. for 32 hours. The mixture was filtrated and the filtrate was concentrated. The obtained residue was mixed with 412.3 parts of chloroform and the mixture was separated to obtain the organic layer and the aqueous layer. The organic later obtained was repeated to wash with 209.4 parts of an ion-exchanged water until the aqueous layer obtained was neutralized. The organic layer obtained was mixed with 4.7 parts of active carbon and the resultant mixture was filtrated. The filtrate was concentrated and the obtained residue was dissolved in 100.9 parts of acetonitrile and the obtained solution was concentrated. The obtained residue was mixed with 62.7 parts of tert-butyl methyl ether. The mixture was filtrated to obtain the solid. The solid obtained was dried to obtain 8.4 parts of the salt represented by the above-mentioned formula (b), which is called as B2.

$^1$H-NMR (dimethylsulfoxide-$d_6$, Internal standard: tetramethylsilane): δ (ppm) 7.73-7.94 (m, 18H), 8.03-8.13 (m, 2H), 8.21 (dd, 1H, J=7.6 Hz, 1.3 Hz), 8.45 (dd, 1H, J=7.8 Hz, 1.3 Hz)

Synthesis Example 3

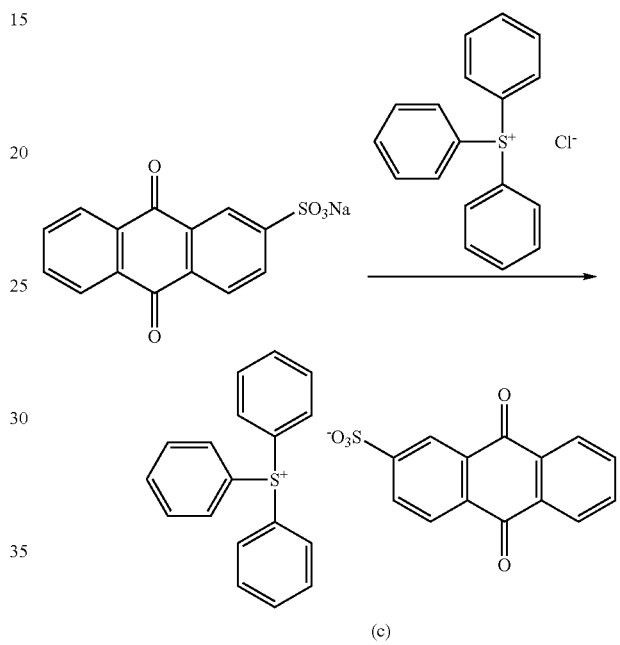

(c)

Sixty one point one parts of chloroform, 5.0 parts of sodium 9,10-anthraquinone-2-sulfonate and 33.9 parts of 14.2% by weight aqueous solution of triphenylsulfonium chloride were mixed and the resultant mixture was stirred at room temperature over night. The mixture was separated to obtain the organic layer and the aqueous layer. The organic later obtained was repeated to wash with 30.5 parts of an ion-exchanged water until the aqueous layer obtained was neutralized. The organic layer obtained was mixed with 1.0 parts of active carbon and the resultant mixture was filtrated. The filtrate was concentrated and the obtained residue was dissolved in 26.3 parts of acetonitrile and the obtained solution was concentrated to obtain 4.7 parts of the salt represented by the above-mentioned formula (c), which is called as B3.

$^1$H-NMR (dimethylsulfoxide-$d_6$, Internal standard: tetramethylsilane): δ (ppm) 7.74-7.96 (m, 17H), 8.08 (dd, 1H, J=7.9 Hz, 1.6 Hz), 8.17-8.24 (m, 3H), 8.40 (d, 1H, J=1.8 Hz)

Synthesis Example 4

Into a four-necked flask equipped with a condenser, a stirrer and a thermometer, 179.2 parts of 4-acetoxystyrene, 48.4 parts of 2-ethyl-2-adamantyl methacrylate and 306 parts of methyl isobutyl ketone were charged and the resultant mixture was heated to 80° C. To the mixture, a solution prepared by dissolving 13.5 parts of dimethyl-2,2'-azobis(2-methylpropionate) in 36.0 parts of methyl isobutyl ketone was added dropwise over 10 minutes. The resultant mixture was kept at 80° C. for 15 hours. The reaction mixture obtained was poured into a solution prepared by mixing 4,660 parts of methanol with 583 parts of water while stirring. The precipitated resin was collected by filtration. The obtained resin was mixed with 751 parts of methanol and 25.4 parts of 4-dimethylaminopyridine was added to the resultant mixture. The mixture obtained was kept at 62° C. for 15 hours. To the mixture, 37.5 parts of glacial acetic acid was added to stir for 30 minutes. The mixture was poured into 6,830 parts of water while stirring and the resin precipitated was collected by filtration. The resin was washed with water and dried under reduced pressure to obtain 174.5 parts of a resin having structural units derived from p-hydroxyxtyrene and 2-ethyl-2-adamantyl methacrylate.

Into a four-necked flask equipped with a condenser, a stirrer and a thermometer, 174.5 parts of the resin obtained and 1,047 parts of acetone were charged to obtain a solution. To the solution, 19.7 parts of triethylamine was added and the resultant mixture was heated to 40° C. To the mixture, 18.3 parts of benzoyl chloride was added dropwise over 30 minutes and the resultant mixture was kept at 40° C. for 3 hours. The obtained mixture was mixed with 698 parts of ethyl acetate and 640 parts of 0.5% aqueous solution of oxalic acid. the resultant mixture was separate to obtain the organic layer and the aqueous layer. The organic later obtained washed with an aqueous solution of oxalic acid. The obtained organic layer was mixed with 698 parts of ethyl acetate, 698 parts of propylene glycol methyl ether acetate and 436 parts of water. The resultant mixture was stirred and separated to obtain the organic layer. The organic layer was washed four times with water and concentrated under reduced pressure. The residue was mixed with propylene glycol methyl ether acetate to concentrate under reduced pressure to obtain 543 parts of a propylene glycol methyl ether acetate solution containing the resin (the content of the solid: 33.7%). The resin obtained is called as A1.

The polymerization units of the resin A1 were following polymerization units (A), (B) and (C).

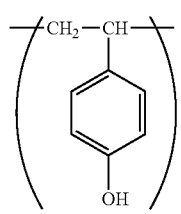

(A)

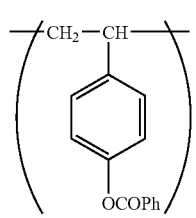

(B)

-continued

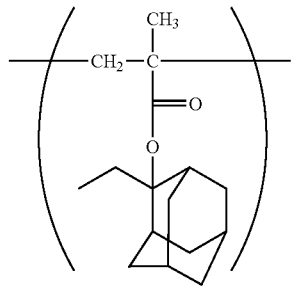

(C)

The weight-average molecular weight of the resin A1 was about 9,800 and the degree of dispersion (Mw/Mn) of the resin A1 was 1.73. The ratio of the polymerization units (A), (B) and (C) in the resin A1 was 74/12/14 by $^{13}$C-NMR analysis.

Synthesis Example 5

Five hundred sixty eight parts of a propylene glycol methyl ether acetate solution containing the resin having the polymerization units (A), (B) and (C) (the content of the solid: 35.4%) was obtained according to a same manner as that of Synthesis Example 4, except that the amounts of 4-acetoxystyrene, 2-ethyl-2-adamantyl methacrylate and benzoyl chloride were changed.

The resin obtained is called as A2.

The weight-average molecular weight of the resin A2 was about 9,100 and the degree of dispersion of the resin A2 was 1.72.

The ratio of the polymerization units (A), (B) and (C) in the resin A2 was 69/17/14 by $^{13}$C-NMR analysis.

<Acid Generator>

Acid generator B1:

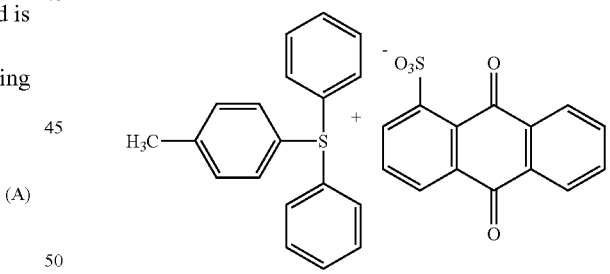

Acid generator B2:

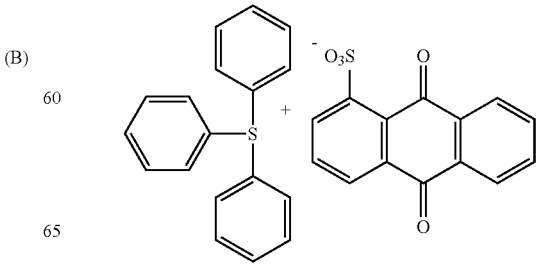

Acid generator B3:

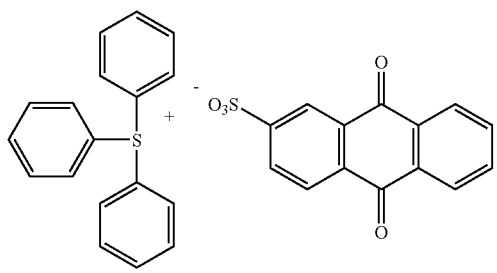

Acid generator B4: triphenylsulfonium 2,4,6-triisopropylbenzenesulfonate

Acid generator B5: bis(cyclohexylsulfonyl)diazomethane

Acid generator B6: triphenylsulfonium 2-naphtharene sulfonate

Acid generator B7: 4-methylphenyldiphenylsulfonuim perfluorobutanesulfonate

<Quencher>

Quencher C1: diisopropylaniline

<Solvent>

Solvent S1: propylene glycol monomethyl ether acetate/propylene glycol monomethyl ether (weight ratio=8/2)

Examples 1 to 3 and Comparative Examples 1 to 3

The following components were mixed to give a solution, and the solution was further filtrated through a fluorine resin filter having a pore diameter of 0.2 μm, to prepare resist liquid.

Resin (kind and amount are described in Table 1)
Acid generator (kind and amount are described in Table 1)
Quencher (kind and amount are described in Table 1)
Solvent (kind and amount are described in Table 1)

TABLE 1

| Ex. No. | Resin (kind/amount (part)) | Acid generator (kind/amount (part)) | Quencher (kind/amount (part)) | Solvent (kind/amount (part)) |
|---|---|---|---|---|
| Ex. 1 | A1/100 | B1/5.63 B4/3.33 | C1/0.44 | S1/1333.33 |
| Ex. 2 | A1/100 | B2/5.48 B4/3.33 | C1/0.44 | S1/1333.33 |
| Ex. 3 | A1/100 | B3/5.48 B4/3.33 | C1/0.44 | S1/1333.33 |
| Comp. Ex. 1 | A1/100 | B4/3.33 B5/3.33 | C1/0.44 | S1/1333.33 |
| Comp. Ex. 2 | A1/100 | B4/3.33 B6/4.69 | C1/0.44 | S1/1333.33 |
| Comp. Ex. 3 | A1/100 | B5/3.33 B7/3.51 | C1/0.44 | S1/1333.33 |

Each of the resist liquids prepared as above was spin-coated over the silicon wafer. After coating each of the resist liquids, the silicon wafers thus coated with the respective resist liquids were each prebaked on a proximity hotplate at a temperature of 100° C. for 60 seconds to form resist film of which thickness was 0.24 μm. Using a KrF excimer laser stepper ("NSR-2205EX12B" manufactured by Nikon Corporation, NA=0.55, σ=0.80), each wafer on which the respective resist film had been thus formed was exposed via several masks having different shapes and size.

After the exposure, each wafer was subjected to post-exposure baking on a hotplate at a temperature of 110° C. for 60 seconds and then to paddle development for 60 seconds with an aqueous solution of 2.38% tetramethylammonium hydroxide.

Each of a pattern developed on the substrate after the development was observed with a scanning electron microscope, and the results of which are shown in Table 2.

Effective Sensitivity (ES): It is expressed as the amount of exposure that the line and space pattern become 1:1 after exposure through 0.25 μm line and space pattern mask and development.

Resolution: It is expressed as the minimum size of space pattern which gave the space pattern split by the line pattern at the exposure amount of the effective sensitivity.

Each of the resist liquids prepared as above was spin-coated over the several silicon wafers. After coating each of the resist liquids, the silicon wafers thus coated with the respective resist liquids were each prebaked on a proximity hotplate at a temperature of 100° C. for 60 seconds to form the several resist films of which thickness were 0.20 to 0.30 μm. Using a KrF excimer laser stepper ("NSR-2205EX12B" manufactured by Nikon Corporation, NA=0.55, σ=0.80), each wafer on which the respective resist film had been thus formed was exposed.

After the exposure, each wafer was subjected to post-exposure baking on a hotplate at a temperature of 110° C. for 60 seconds and then to paddle development for 60 seconds with an aqueous solution of 2.38% tetramethylammonium hydroxide.

Each of a pattern developed on the substrate after the development was observed with a scanning electron microscope.

The line and space patterns after exposure through 0.25 μm line and space pattern mask and development at the constant exposure amount were observed. The line widths of the patterns (CD) were measured and the differences between the maximum line width of the pattern and the minimum line width of the pattern (CD-SW) were calculated. The smaller the value of CD-SW was, the better the pattern was.

The results are shown in Table 2.

TABLE 2

| Ex. No. | Resolution (μm) | CD-SW (nm) |
|---|---|---|
| Ex. 1 | 0.18 | 71 |
| Ex. 2 | 0.19 | 83 |
| Ex. 3 | 0.19 | 83 |
| Comp. Ex. 1 | 0.21 | 98 |
| Comp. Ex. 2 | 0.19 | 111 |
| Comp. Ex. 3 | 0.20 | 130 |

The present chemically amplified positive resist compositions give patterns having high resolution and good profile.

What is claimed is:

1. A chemically amplified positive resist composition comprising (A) a salt represented by the formula (I):

$$A^+\ {}^-O_3S\text{—}R \qquad (I)$$

wherein R represents a 9,10-anthraquinonyl group which may be substituted with at least one group selected from the group consisting of a C1-C4 alkyl group, a C1-C4 alkoxy group and a hydroxyl group, and the C1-C4 alkyl group and the C1-C4 alkoxy group may be substituted, and $A^+$ represents an organic counter cation, and (B) a resin which contains a structural unit which has an acid-labile group and which itself is insoluble or poorly soluble in an aqueous alkali solution but becomes soluble in an aqueous alkali solution by the action of an acid.

2. The chemically amplified positive resist composition according to claim 1, wherein R represents an unsubstituted 9,10-anthraquinonyl group.

3. The chemically amplified positive resist composition according to claim 1, wherein the content of the structural unit which has an acid-labile group in the resin is 5 to 80% by mole based on the sum of all the structural units in the resin.

4. The chemically amplified positive resist composition according to claim 1, wherein the structural unit which has an acid-labile group is a structural unit derived from a 2-alkyl-2-adamantyl acrylate, a 2-alkyl-2-adamantyl methacrylate, a 1-(1-adamantyl)-1-alkylalkyl acrylate or a 1-(1-adamantyl)-1-alkylalkyl methacrylate.

5. The chemically amplified positive resist composition according to claim 1, wherein the resin further comprises at least one structural unit selected from the group consisting of a structural unit derived from a hydroxystyrene and a structural unit derived from acyloxystyrene.

6. The chemically amplified positive resist composition according to claim 1, wherein the chemically amplified positive resist composition further comprises a onium salt as an acid generator.

7. The chemically amplified positive resist composition according to claim 1, wherein the chemically amplified positive resist composition further comprises a diazomethane compound having a sulfonyl group as an acid generator.

8. The chemically amplified positive resist composition according to claim 1, wherein the chemically amplified positive resist composition further comprises a basic compound.

* * * * *